(12) United States Patent
Sharpe-Geisler et al.

(10) Patent No.: US 7,868,646 B1
(45) Date of Patent: Jan. 11, 2011

(54) SOFT ERROR UPSET HARDENED INTEGRATED CIRCUIT SYSTEMS AND METHODS

(75) Inventors: Brad Sharpe-Geisler, San Jose, CA (US); Satwant Singh, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 12/818,544

(22) Filed: Jun. 18, 2010

Related U.S. Application Data

(63) Continuation of application No. 12/430,848, filed on Apr. 27, 2009, now Pat. No. 7,741,865, which is a continuation of application No. 11/370,546, filed on Mar. 7, 2006, now abandoned.

(51) Int. Cl.
H03K 19/007 (2006.01)
H03K 19/177 (2006.01)

(52) U.S. Cl. .......................................... 326/14; 326/40
(58) Field of Classification Search ............... 326/9–15, 326/41
See application file for complete search history.

(56) References Cited

U.S. PATENT DOCUMENTS

| | | | | |
|---|---|---|---|---|
| 5,825,202 A * | 10/1998 | Tavana et al. | ................. | 326/39 |
| 5,870,327 A * | 2/1999 | Gitlin et al. | .................... | 365/96 |
| 5,886,392 A * | 3/1999 | Schuegraf | ................... | 257/530 |
| 6,128,218 A * | 10/2000 | You et al. | ................... | 365/156 |
| 6,208,549 B1 * | 3/2001 | Rao et al. | ...................... | 365/96 |
| 6,237,124 B1 * | 5/2001 | Plants | ........................ | 714/763 |
| 6,625,080 B2 * | 9/2003 | Casper et al. | ............ | 365/225.7 |
| 7,023,744 B1 * | 4/2006 | Shimanek et al. | ...... | 365/189.11 |
| 7,036,059 B1 * | 4/2006 | Carmichael et al. | ......... | 714/725 |
| 7,064,574 B1 * | 6/2006 | Voogel et al. | .................. | 326/9 |
| 7,200,235 B1 * | 4/2007 | Trimberger | ................. | 380/277 |
| 2004/0165418 A1 * | 8/2004 | Lesea | ......................... | 365/154 |
| 2004/0227551 A1 * | 11/2004 | Gardner | ...................... | 327/215 |
| 2004/0257108 A1 * | 12/2004 | Carlson et al. | ................ | 326/14 |
| 2007/0103185 A1 * | 5/2007 | Friedman | ..................... | 326/14 |
| 2007/0111403 A1 * | 5/2007 | Jiang et al. | .................. | 438/132 |

* cited by examiner

*Primary Examiner*—James H. Cho
*Assistant Examiner*—Matthew C Tabler

(57) ABSTRACT

In one embodiment, a programmable logic device includes a plurality of configuration cells that store configuration data, wherein the programmable logic device is adapted to provide soft error upset (SEU) protection for the configuration cells that are reprogrammable. The programmable logic device may further include or alternatively provide hard coding and/ or hard encoding of the configuration cells.

20 Claims, 15 Drawing Sheets

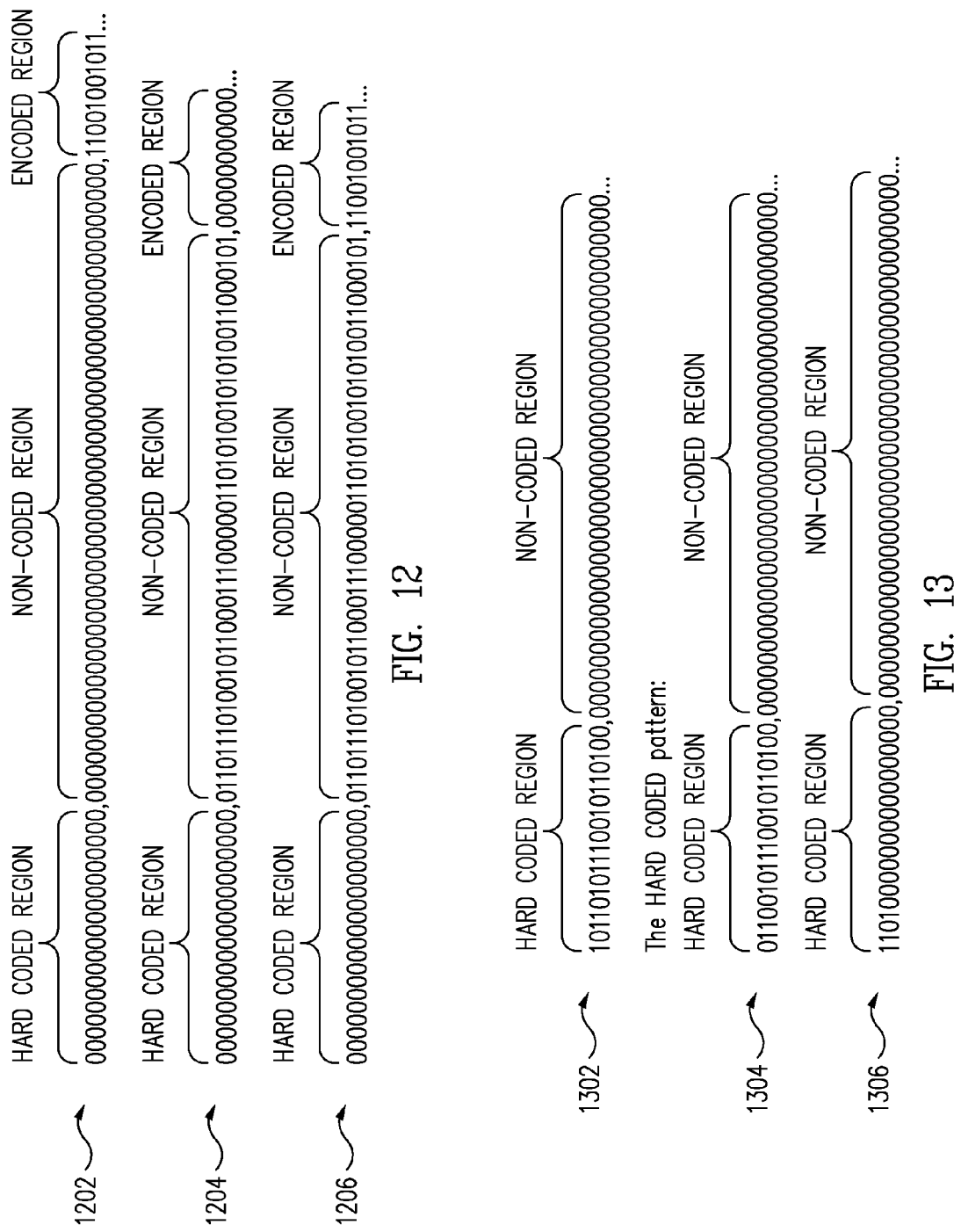

SOFT ERROR UPSET HARDENED INTEGRATED CIRCUIT SYSTEMS AND METHODS

RELATED APPLICATION DATA

This application is a continuation of U.S. application Ser. No. 12/430,848, filed Apr. 27, 2009, which is a continuation of U.S. application Ser. No. 11/370,546, filed Mar. 7, 2006, both of which are incorporated herein by reference in their entirety.

TECHNICAL FIELD

The present invention relates generally to electrical circuits and, more particularly, to soft error upset hardening and associated techniques.

BACKGROUND

A soft error upset (SEU) refers generally to a change of state or a transient induced in one or more signal values in a semiconductor device (e.g., when struck by an ionizing particle, such as a neutron or an alpha particle). For example, a programmable logic device (PLD), such as a field programmable gate array (FPGA) or a complex PLD (CPLD), are configured by data stored in configuration memory cells (e.g., SRAM cells), which are susceptible to SEUs that change the originally programmed data state (e.g., programmed a "1" but SEU changes value to "0"). One or more SEUs within the PLD may be particularly noticeable because the data stored in the configuration memory cells determines the PLD's functionality.

One conventional approach, for example, to the PLD's SEU vulnerability includes replacing the SRAM-based configuration cells with non-volatile memory cells (e.g., EEPROM zero power memory cells). However, non-volatile memory cells generally require more silicon area and are often more expensive to implement. Another approach employs mask changes to hardwire the SRAM configuration cells to their desired value (e.g., "0" or "1") based on a given design and application or to convert the design to an application specific integrated circuit. A drawback of this approach is that the hardwired SRAM configuration cells or ASIC can no longer be reprogrammed, which is a fundamental benefit of a PLD. Furthermore, testing often becomes difficult because the test procedures typically rely on the PLD's programmability for full testability by the manufacturer. As a result, there is a need for improved techniques directed, for example, to SEU issues associated with PLDs or other programmable memory devices.

BRIEF DESCRIPTION OF THE DRAWINGS

FIGS. 10-13 show exemplary bit streams for providing hard coding and/or hard encoding techniques in accordance with embodiments of the present invention.

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
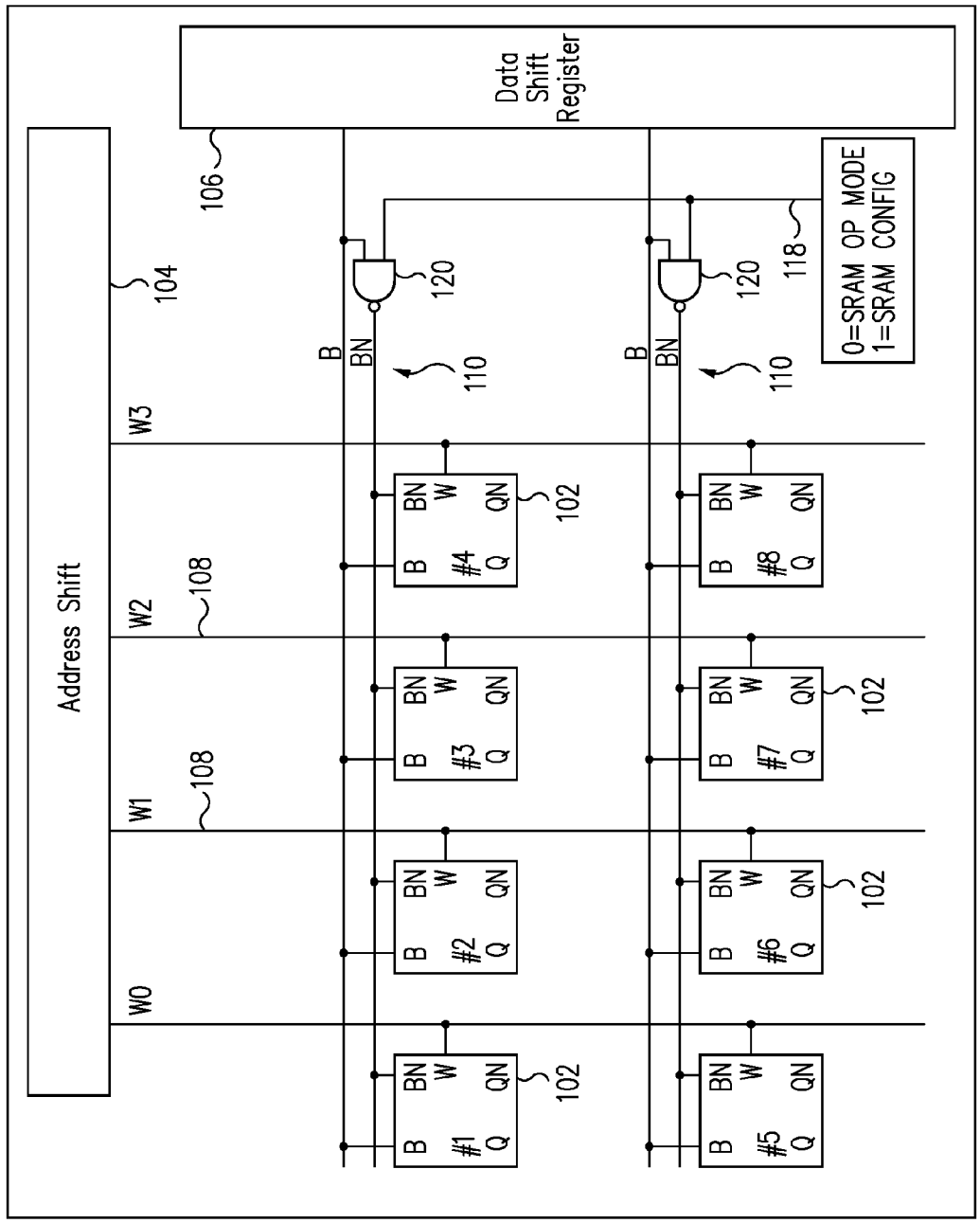
FIG. 1 shows a block diagram illustrating a conventional configuration scheme for a programmable logic device.

FIG. 1 shows a block diagram illustrating a conventional configuration scheme for a programmable logic device (PLD) 100. PLD 100 includes configuration cells (e.g., SRAM cells) 102, an address shift register (ASR) 104, and a data shift register (DSR) 106. PLD 100 also typically includes logic blocks 112, an interconnect structure 114, and memory blocks 116, shown as blocks in FIG. 1, but whose conventional functionality would be understood by one skilled in the art.

Figure 2:
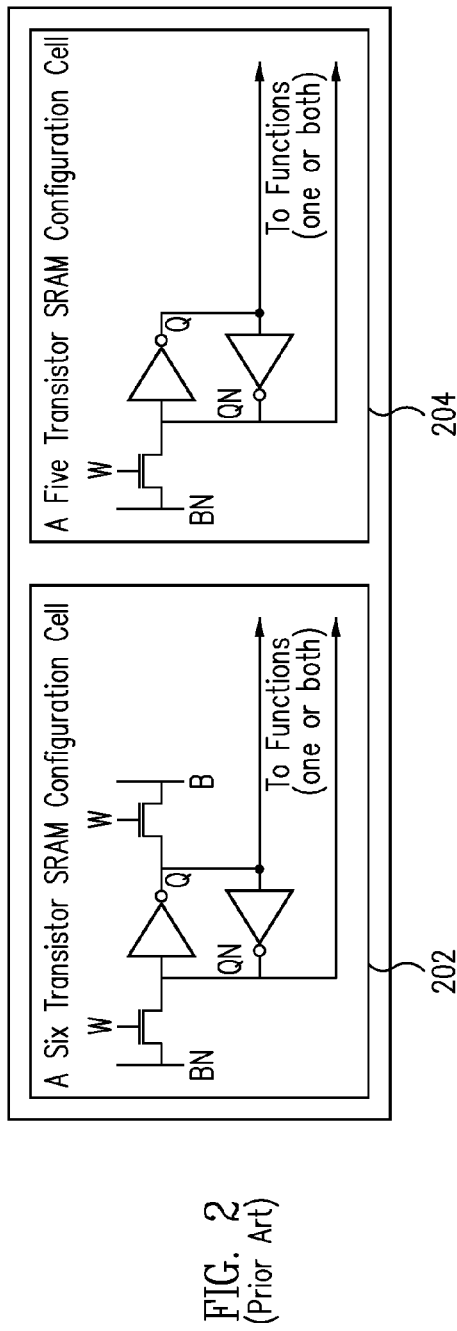
FIG. 2 shows block diagrams illustrating conventional static random access memory cells.

Configuration cells 102 are generally arranged in a two-dimensional fashion (e.g., within the interconnect structure, logic blocks, and other parts of PLD 100) and may number in the thousands or millions, but for clarity only two rows and four columns of configuration cells 102 are shown. As an implementation example for configuration cells 102, FIG. 2 shows block diagrams illustrating conventional static random access memory (SRAM) cells 202 and 204. SRAM cell 202 represents an exemplary six-transistor SRAM cell (6T cell), while SRAM cell 204 represents an exemplary five-transistor SRAM cell (5T cell).

As is illustrated, configuration cells 102 of FIG. 1 are shown implemented with SRAM cells 202 (e.g., complementary bitlines, with each configuration cell 102 representing one SRAM cell 202), but in a similar fashion could also be implemented with SRAM cells 204 as would be understood by one skilled in the art. The Q and/or QN output signals from SRAM cells 202 and 204 are used to control user-programmable functions within PLD 100, while signals associated with W, B, and BN for SRAM cell 202 and W and BN for SRAM cell 204 are used to program the respective SRAM cell 202 and SRAM cell 204.

Referring back to FIG. 1, ASR 104 control wordlines 108 (e.g., labeled W0 through W3), while DSR 106 controls bitlines 110 (e.g., complementary bitlines labeled B and BN). A control line 118 determines whether DSR 106 is permitted to provide configuration data via bitlines 110 to configuration cells 102 (e.g., a logical high on control line 118 to logic gates 120 permits logic gates 120 to pass configuration data provided by DSR 106).

As a programming example, ASR 104 drives a logical low signal on wordlines 108, while DSR 106 drives a data signal for one column on bitlines 110 (i.e., complementary data signals on B and BN). ASR 104 then drives a logical high signal on one wordline 108 (e.g., wordline 108 labeled W0), while maintaining the logical low signal on the remaining wordlines 108 so that the data on bitlines 110 is written into configuration cells 102 associated with the one wordline 108 (wordline 108 labeled W0). After the data is written for the one column, ASR 104 drives a logical low signal on wordlines 108 and the process repeats for each column of data to be written.

After the configuration data is programmed into configuration cells 102, PLD 100 begins its normal operation (often referred to as "user mode") to perform the logic functions and operate as intended for the particular design. Typically, during user mode, ASR 104 maintains a logical low signal on wordlines 108 and DSR 106 maintains a logical high signal on bitlines 110. Furthermore, generally testing of PLD 100 is performed by the manufacturer by programming PLD 100 with patterns and then running test vectors to verify correct operation.

As discussed herein, SRAM cells 202 and 204 are susceptible to soft error upsets (SEUs) when implemented in a conventional fashion as configuration cells 102. However, in accordance with one or more embodiments of the present invention, techniques are disclosed to provide SEU hardened PLDs. For example, as explained further herein, one technique in accordance with an embodiment of the present invention includes a seven-transistor cell (7T cell) implemented for each configuration cell 102, which operates as a 6T cell with mask customization for the seventh transistor to tie the 7T cell to a hard logical 0 or 1. As a further example in accordance with an embodiment of the present invention, another technique includes a 6T cell, which is provided as a 5T cell with mask customization for the sixth transistor to tie the 5T cell to a hard logical 0 or 1. As a further example in accordance with an embodiment of the present invention, another technique includes for example the 6T cell with SEU hardening, which may further include swapping the Q/QN output signal connection to provide hard coding, as explained further herein.

Figure 3:
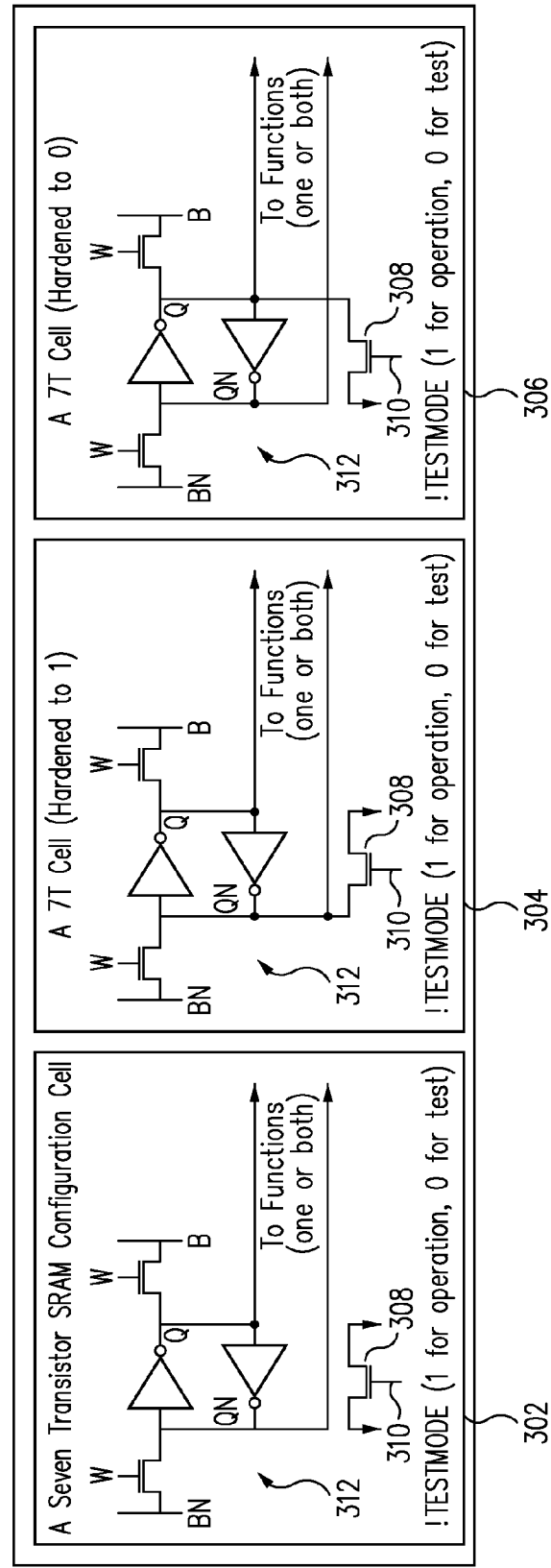
FIGS. 3-5 show block diagrams illustrating soft error upset hardened static random access memory cells in accordance with embodiments of the present invention.
Figure 4:
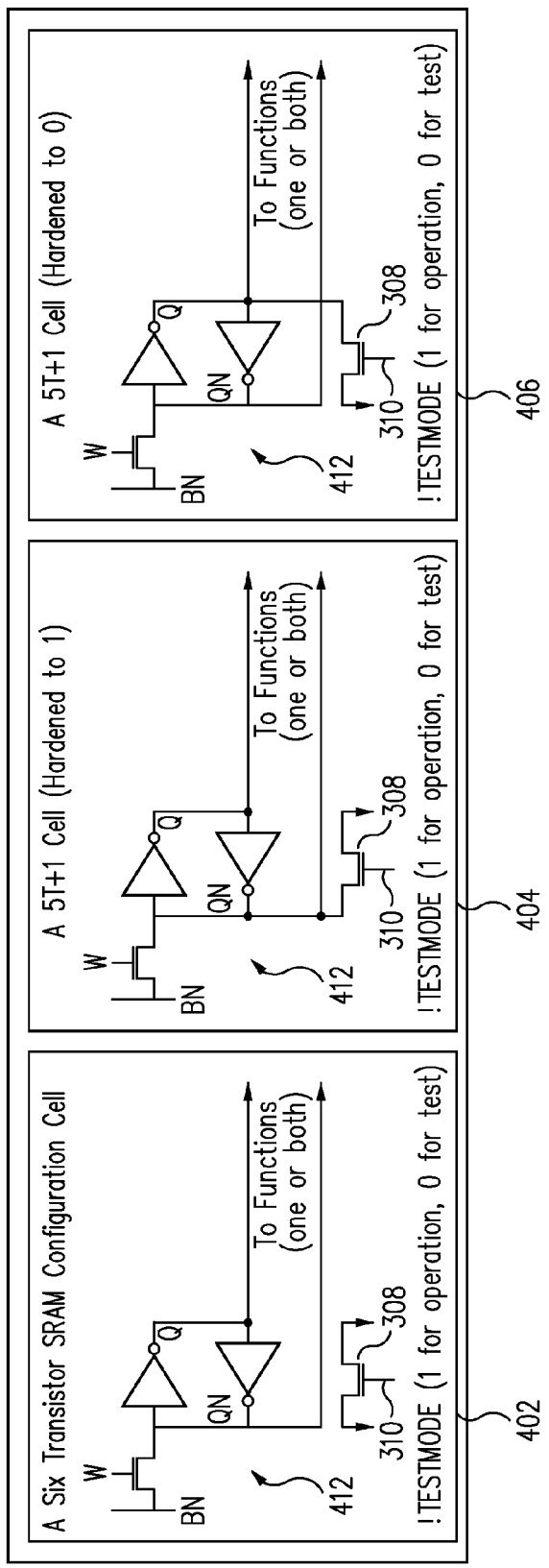
Figure 5:
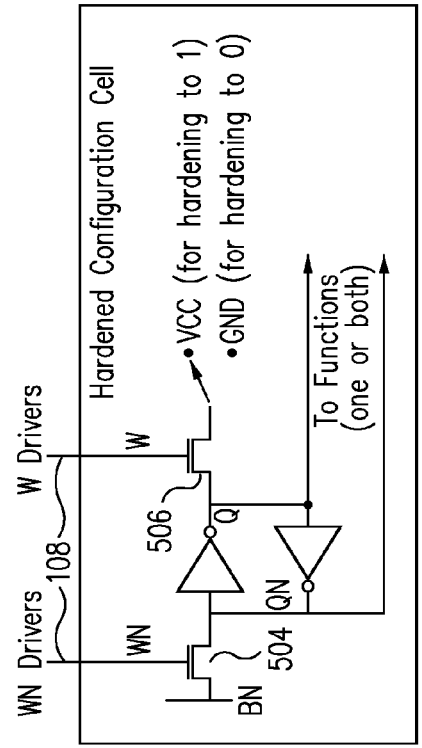

For example, FIGS. 3-5 show block diagrams illustrating exemplary SRAM cells that can be SEU hardened in accordance with one or more embodiments of the present invention. It should be understood that the SEU hardened SRAM cells and related techniques may be implemented for all or a portion of the configuration cells within the PLD.

Specifically for FIG. 3, an SRAM cell 302 includes six transistors that form a conventional 6T cell 312 (i.e., two inverters and two transistors coupling the inverters to the bitlines (B and BN)) and a transistor 308 (i.e., the seventh transistor). In general, transistor 308 does not take part in any operation of 6T cell 312 as shown in SRAM cell 302, with source and drain terminals of transistor 308 connected to ground. Consequently, 6T cell 312 operates in a conventional fashion and is susceptible to a SEU. However, if desired, 6T cell 312 can be SEU hardened to a logical one or a logical zero via one or more custom masks, as illustrated by schematic configurations of SRAM cells 304 and 306, respectively.

A control signal 310 (labeled !TESTMODE) controls transistor 308 and allows the PLD to be tested in a conventional fashion. For example, control signal 310 provides a logical low signal to transistor 308 during testing to allow 6T cell 312 to operate in a conventional fashion (i.e., transistor 308 is off and conventional testing may be performed), but would apply a logical high signal during regular SEU hardened operation (i.e., transistor 308 is on and 6T cell 312 is tied for SEU hardening).

For example, SRAM cell 304 is SEU hardened to a logical one with transistor 308 configured via one or more masks to pull the QN node to ground. Thus, SRAM cell 304 acquires a hardened logical one state, which may be viewed as equivalent SEU hardening as an application specific integrated circuit (ASIC) gate. Similarly, SRAM cell 306 is SEU hardened to a logical zero with transistor 308 configured via one or more masks to pull the Q node to ground. Thus, SRAM cell 306 acquires a hardened logical zero state and any SEU does not disturb permanently the value stored by SRAM cell 306.

This technique may be applied in a similar fashion, in accordance with an embodiment of the present invention, to any type of SRAM cell. For example, FIG. 4 illustrates this technique applied to an SRAM cell 402 that includes five transistors that form a conventional 5T cell 412 (i.e., two inverters and one transistor coupling the inverters to the bitline BN) and transistor 308 (i.e., the sixth transistor).

As illustrated by SRAM cells 404 and 406, 5T cell 412 can be SEU hardened via one or more masks by coupling transistor 308 to the Q or QN node, as described similarly above for 6T cell 312 of FIG. 3. It should be noted that 5T cell 412 may be more applicable to more mature technologies that utilize thicker gate oxides and operate at higher voltages (e.g., 3.3 or 2.5 V) or mixed voltage processes that would more easily allow 5T cell 412 to be programmed with a logical one or a logical zero, as would be understood by one skilled in the art.

In general in reference to FIGS. 3 and 4, the general design steps may include using a PLD with its current configuration cell (e.g., SRAM cell susceptible to SEUs) unchanged during prototype stages of a system design. Once the PLD's desired programming or configuration is determined and the design set, an SEU hardened version of the PLD is requested. The PLD manufacture will then generate one or more masks specific to that design and process the wafers with these custom masks to produce an SEU hardened version of the conventional PLD having configuration cells hardened as described in reference to FIGS. 3 and 4.

Consequently, the PLD is hardened for that specific customer pattern or design. However, this hardened PLD, as described herein, is still fully programmable (e.g., by application of control signal 310) and consequently may be tested in a conventional fashion rather than requiring a user's specific fault grading test vectors. For customers of the PLD that do not require hardening, these customers may continue to use the PLD without any SEU hardened customization or having to pay little if any additional cost for the PLDs. For the PLD customers that do require SEU hardening, a one-time charge of cutting one or more masks may be incurred. However, the manufacturing production costs for the SEU hardened PLDs may increase only marginally, if at all, to provide the customized, hardened PLD design.

FIG. 5 illustrates another SEU hardening technique for an SRAM cell 500 in accordance with an embodiment of the present invention. SRAM cell 500 is a variation of the 5T cell and utilizes wordlines 108 (W and WN) rather than control signal 310 for SEU hardening. In general, SRAM cell 500 functions in a conventional manner when SEU hardening is not required, but is capable of being SEU hardened, if desired. As noted above, the 5T cell may be more applicable to mature technologies with higher voltage levels or in applications where thick gate-oxides or higher dielectric constant materials are acceptable for transistors 504 and 506. However, the technique illustrated in FIG. 5 may also be applied to other types of SRAM cells, as would be understood by one skilled in the art, and may also be applied to all or a portion of the configuration cells within the PLD.

As an example of operation, SRAM cell 500 may be programmed and operate generally in a conventional manner by controlling wordlines 108 and providing a data signal on the bitline (BN). If testing is desired, wordline 108 (W) provides a logical low signal to maintain transistor 506 in an off state, while wordline 108 (WN) and the bitline (BN) are controlled to program SRAM cell 500 with the desired value for testing. During testing, wordline 108 (W) continues to provide the logical low signal so that SRAM cell 500 maintains its programmed state. However, if SEU hardening is desired during user mode, then wordline 108 (WN) provides a logical low signal and wordline 108 (W) provides a logical high signal to switch transistors 504 and 506 off and on, respectively. Consequently, SRAM cell 500 maintains the value dictated by whether transistor 506 is tied to a logical high or low value. For example, transistor 506 may be coupled (e.g., by proper via selection) to a supply voltage (VCC) or a ground voltage (GND) to harden SRAM cell 500 to a logical high or a logical low, respectively.

Figure 6:
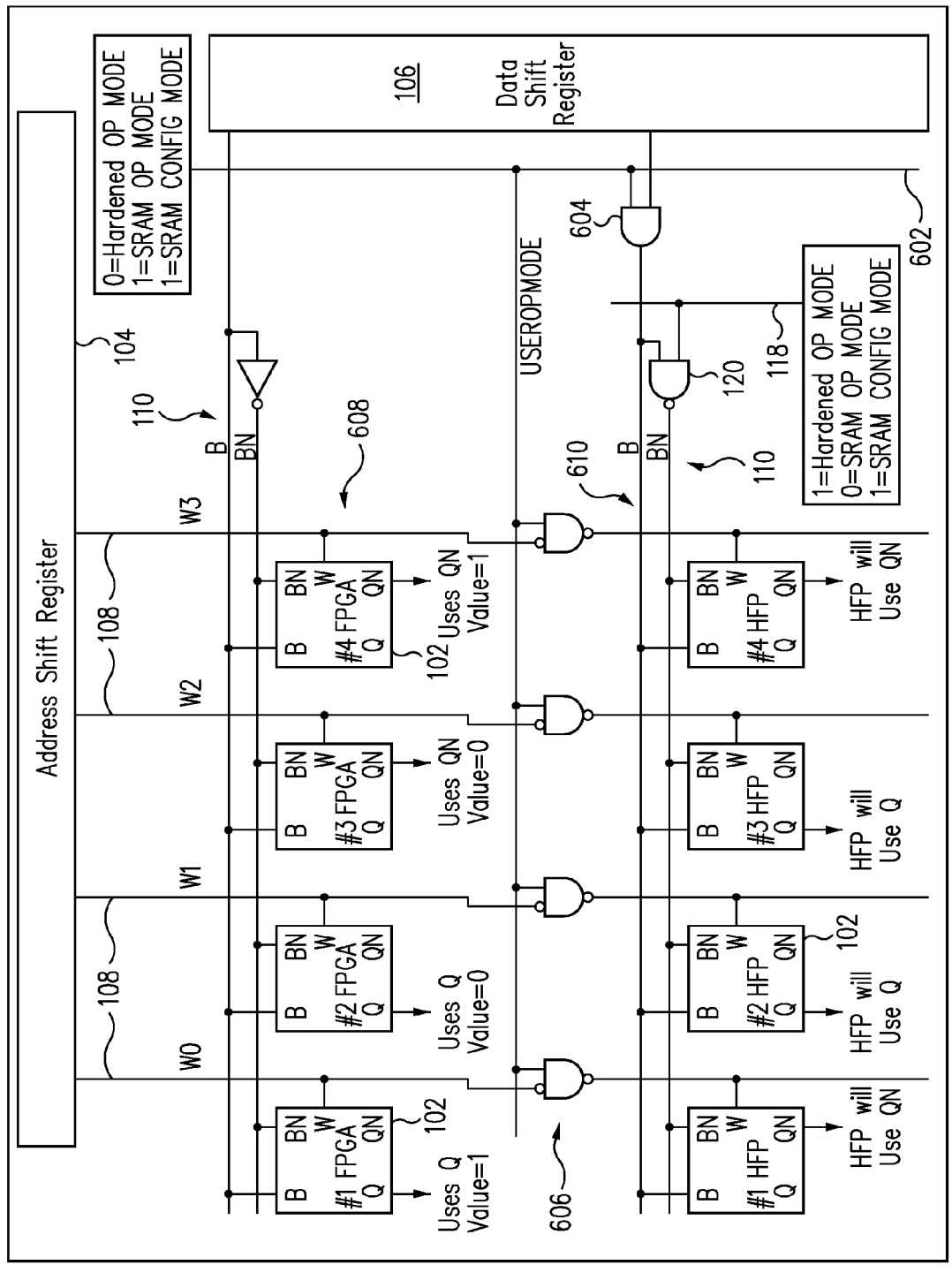
FIG. 6 shows a block diagram illustrating a soft error upset hardening technique in accordance with an embodiment of the present invention.
Figure 6:
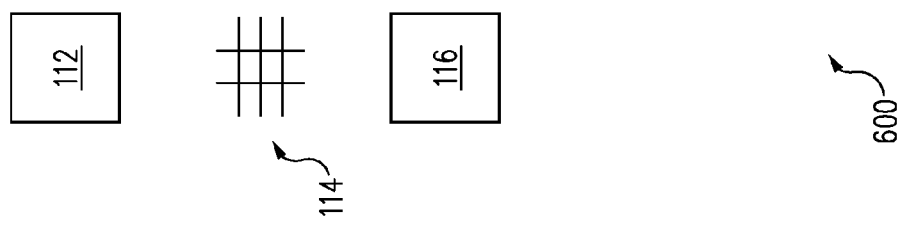

The configuration cells (e.g., configuration cells 102) may also be hardened, in accordance with one or more embodiments of the present invention, without changing the conventional configuration cell (e.g., SRAM cell). For example, FIG. 6 shows a block diagram illustrating functionally an SEU hardening technique for a PLD 600 in accordance with an embodiment of the present invention. PLD 600 includes configuration cells 102 (e.g., conventional SRAM cells), ASR 104, and DSR 106, as described similarly for PLD 100. However, the first row of configuration cells 102 (i.e., a row 608) illustrates a conventional usage of configuration cells 102, while the second row of configuration cells 102 (i.e., a row 610) illustrates configuration cells 102 as used in an SEU hardened version of PLD 600.

PLD 600 further includes a control signal 602, a logic gate 604, and logic gates 606. Control signal 602 provides a logical high signal during the programming of configuration cells 102 and during conventional operation of PLD 600 (i.e., non-SEU hardened). Consequently, logic gate 604 (e.g., AND gate) and logic gates 606 behave as buffers.

For operation of PLD 600 to provide SEU hardened configuration cells, control signal 602 provides a logical low signal so that configuration cells 102 are all programmed with a logical low value. As shown in row 610, during the manufacture of PLD 600, one or more masks were employed to customize PLD 600 as to how the Q and QN output signals from configuration cells 102 of row 610 are used. Thus, control signal 602 is used to hold the value stored by configuration cells 102 (as illustrated in row 610) to provide SEU hardening, as explained further herein, while custom masks set how the Q and QN output signals are used from configuration cells 102.

Configuration cells 102 in rows 608 and 610 illustrate certain aspects of these techniques in accordance with one or more embodiments of the present invention. For example, configuration cells 102 in row 608 illustrate how each configuration cell 102 is used for a particular design for PLD 600. As a specific example, the Q output signal of configuration cell 102 in column one, row 608 (labeled #1 FPGA) is used to control the programmed function and a user design requires this configuration cell 102 to be programmed to a logical high value (e.g., the Q output signal provides a logical high value). The corresponding configuration cell 102 in column one, row 610 (labeled #1 HFP) illustrates the SEU hardened version of configuration cell 102 in column one, row 608.

Specifically for this example, the metal mask customization of configuration cell 102 (#1 HFP) sets the QN output signal to be used (rather than the Q output signal as in configuration cell 102 (#1 FPGA)), because configuration cell 102 (#1 HFP) is programmed to store a logical low value. Thus, configuration cell 102 provides the desired logical high signal, but from the QN output terminal.

The SEU hardening of row 610 of PLD 600 is obtained by providing a logical low signal on control signal 602, which results in logic gates 606 providing a logical high value as an output signal on wordlines 108 (W0 through W3), logic gate 604 providing a logical low value as an output signal on bitline 110 (B) of row 610, and logic gate 120 of row 610 providing a logical high value on bitline 110 (BN) of row 610. Consequently, a logical low value is stored in all of configuration cells 102 of row 610 (i.e., the Q and QN output signals provide logical low and high values, respectively, for these configuration cells 102). Thus, as explained herein, by proper selection of the Q or QN output signal from the SEU hardened configuration cells 102 (e.g., via mask customization), a user's design may be secured from SEUs (e.g., equivalent to that of an ASIC).

If testing is desired, such as by the manufacturer of the PLD, configuration cells 102 within PLD 600 can be programmed in a conventional manner while providing a logical high signal value on control signal 602. However, it should be understood that the intended value of the stored bit must be inverted for those configuration cells 102 having the Q output signal swapped with the QN output signal, as would be understood by one skilled in the art.

Although row 610 of PLD 600 has been used to illustrate certain SEU hardening techniques of configuration cells 102 in accordance with an embodiment of the present invention, it should be understood that this is not limiting. For example, these techniques may be applied to all of the configuration cells 102 within PLD 600 or to configuration cells 102 in certain sections of PLD 600. Furthermore, although a 6T cell was used as an example for configuration cells 102, this also is not limiting as other types of SRAM cells may be implemented and the techniques disclosed herein may be applied to provide similar SEU hardening functionality (e.g., depending upon the desired application or design requirements), as would be understood by one skilled in the art.

Figure 7A:
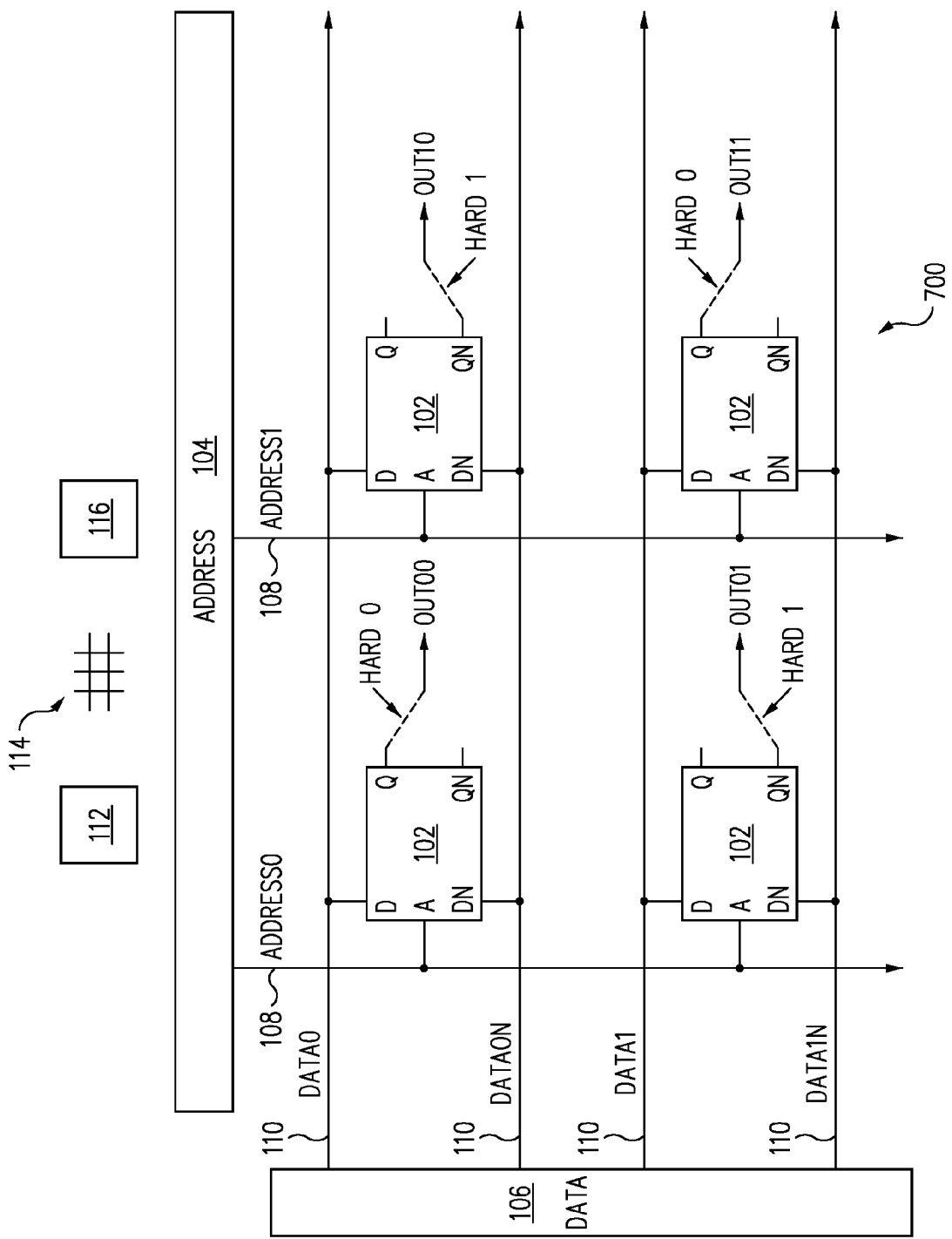
FIG. 7a shows a block diagram illustrating a hard coding technique in accordance with an embodiment of the present invention.
Figure 7B:
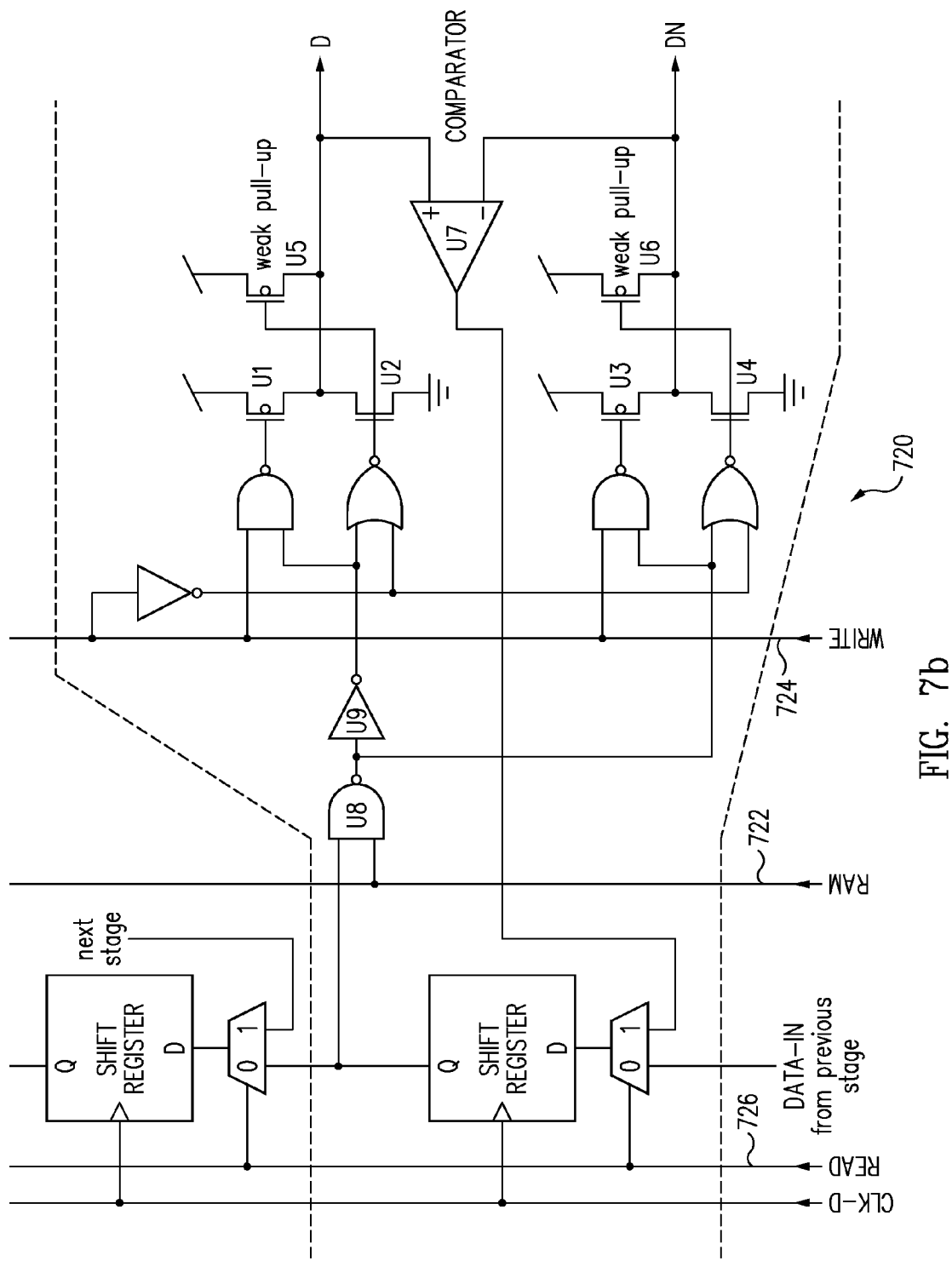
FIGS. 7b and 7c show block diagrams illustrating exemplary circuit implementations for portions of FIG. 6 and/or FIG. 7a in accordance with an embodiment of the present invention.
Figure 7C:
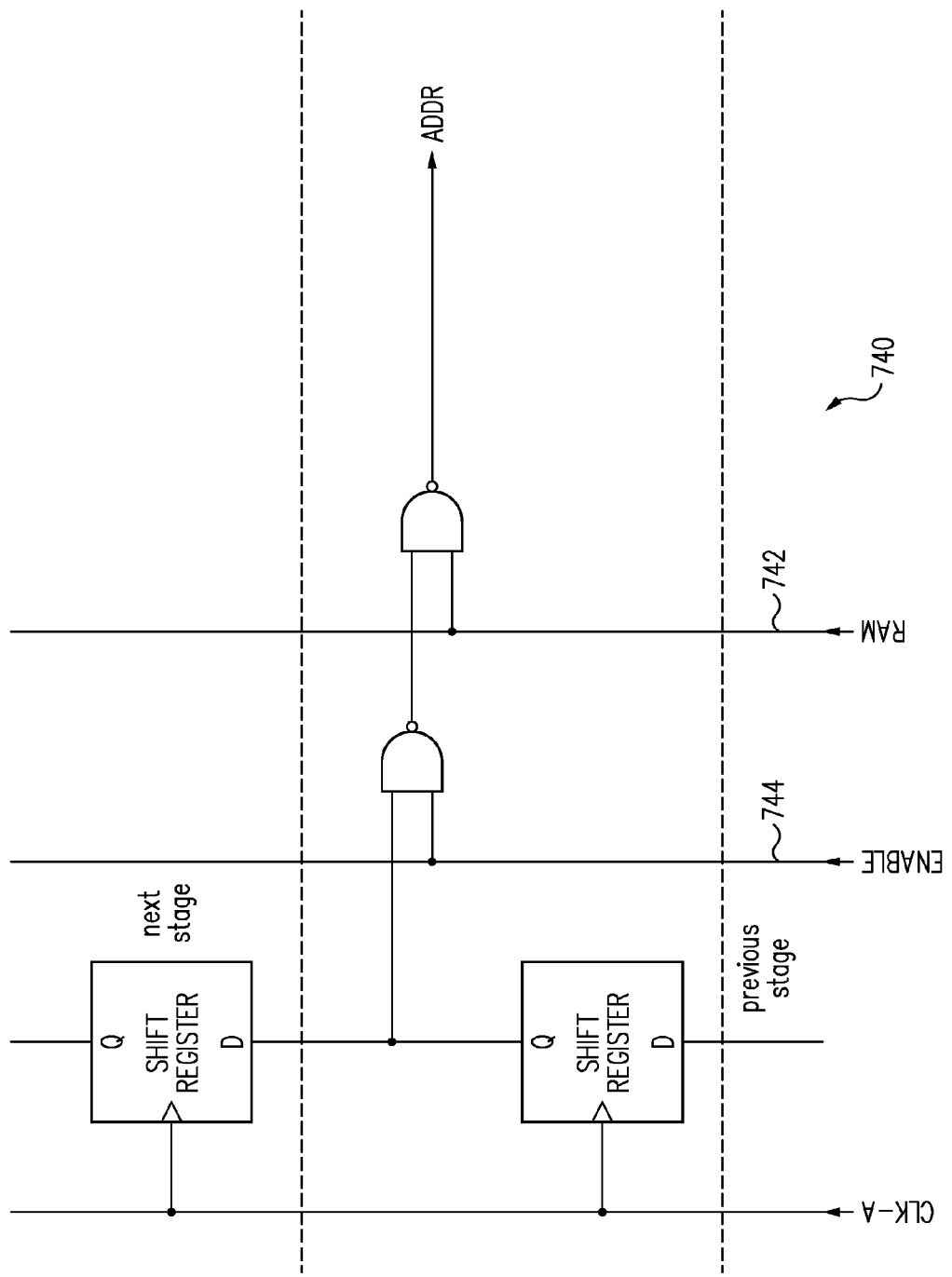

FIG. 6 shows generally an SEU hardening technique, while FIGS. 7a, 7b, and 7c illustrate a specific exemplary implementation in accordance with an embodiment of the present invention. For example, FIG. 7a shows a block diagram of a PLD 700 illustrating a soft error upset hardening technique in accordance with an embodiment of the present invention. PLD 700 represents a conventional PLD architecture for loading in a conventional fashion configuration data into configuration cells 102 via bitlines 110 (also referred to as data lines, such as complementary data lines DATA0 and DATA0N) by proper operation of ASR 104 (controlling wordlines 108, also referred to as address lines) and DSR 106. Once the configuration data is loaded into configuration cells 102, the Q output signal (and possibly QN output signal) from configuration cells 102 are used to determine the function of PLD 700. The data stored in configuration cells 102 may also be verified by addressing and sensing on bitlines 110 the stored value.

In accordance with an embodiment of the present invention, PLD 700 may also provide SEU hardening for configuration cells 102 along with mask customization (e.g., hard coded connections made with via or metal options to provide configurable ROM logic). As discussed similarly in reference to FIG. 6, one or more masks may be employed to customize PLD 700 as to how the Q and QN output signals from configuration cells 102 are used. Furthermore, a hardened logical zero value may be stored in configuration cells 102 by having ADR 104 hold wordlines 108 high while DSR 106 maintains a logical low value on bitline 110 (DATA0) and a logical high value on complementary bitline 110 (DATA0N). In a similar fashion, if desired, a hardened logical one value may be stored in configuration cells 102.

For example as shown in FIG. 7a via mask customization, configuration cell 102 in row 1, column 1 provides a logical zero value (hard 0 as output signal (labeled OUT00)) as its output signal via the Q output signal, while configuration cell 102 in row 1, column 2 provides a logical one value (hard 1) as its output signal via the QN output signal. Similarly in row two, configuration cell 102 in column 1 provides a logical one value (hard 1) as its output signal via the QN output signal, while configuration cell 102 in column 2 provides a logical zero value (hard 0) as its output signal via the Q output signal. Thus, FIG. 7a illustrates a hard coding mechanism, which is based upon the polarity of the bit stored in configuration cell 102 and the hard coded output path from the Q or QN output terminal.

It should be understood that PLD 700 may be programmed in a conventional fashion after mask customization, but the configuration data must be coded based on the mask customization as the hard connections are not generic. Furthermore, as explained further herein, in the hardened mode, if the bit stream is read out of PLD 700 for this example, the configuration data (i.e., ROM code) appears as all logical zero values (erased state). Thus, PLD 700 with mask customization provides configurable ROM logic that provides SEU hardened properties, while still maintaining configurability.

FIGS. 7b and 7c show respectively circuits 720 and 740 illustrating exemplary circuit implementations, which may be applied for portions of FIG. 7a and/or FIG. 6 in accordance with one or more embodiments of the present invention. Specifically for example, circuit 720 provides an exemplary implementation for a portion of DSR 106 of FIG. 7a. For circuit 720, the dashed lines border an exemplary stage of circuit 720 that drives a data line (labeled D, such as representing bitline 110 (DATA0) of FIG. 7a) and a complementary data line (labeled DN, such as representing bitline 110 (DATA0N) of FIG. 7a) associated with a row of SRAM bits (e.g., a row of configuration memory cells 102).

Circuit 720 receives a control signal 722 (RAM) that controls whether circuit 720 functions in a conventional mode or in a hardened mode. In the hardened mode, control signal 722 provides a logical low signal while a write signal 724 provides a logical high signal to force the SRAM bits coupled to the stage to a forced data value (e.g., a logical low value for this exemplary circuit).

For the conventional mode, control signal 722 provides a logical high signal and write signal 724 provides the desired signals as performed in a conventional manner. For example, write signal 724 and a read signal 726 provide a logical low signal and data is shifted in (e.g., clocked in) according to the desired state of the SRAM bits in a column corresponding to a given address line. Write signal 724 then provides a logical high signal, which results in the data lines (D and DN) being driven by transistors U1, U2, U3, and U4 based on the state of the corresponding shift register. After storing the data in the SRAM bits, write signal 724 provides a logical low signal.

If desired, the data in the SRAM bits can be read back into the shift register and clocked out by providing a logical high signal on a read signal 726 and a logical low signal on write signal 724. With the transistors U1, U2, U3, and U4 off, transistors U5 and U6 are switched on and pull the data lines (D and DN) high. Consequently, when an address line (not shown) is pulled high, the corresponding SRAM bit is able to overcome the weak pullup (of either the transistor U5 or U6) and the corresponding data line (D or DN) goes low, which is detected by a comparator U7 and the appropriate value provided to the shift register (as would be understood by one skilled in the art).

In a similar fashion, Circuit 740 of FIG. 7c provides an exemplary implementation for a portion of ASR 104 of FIG. 7a. Note that because transistors U5 and U6 must be weak enough for the SRAM bit to overcome them, precharge transistors are often used to pull data lines D and DN up quickly and, therefore, these precharge transistors would be turned off prior to the address line going high. For circuit 740, the dashed lines border an exemplary stage of circuit 740 that drives an address line (ADDR, such as representing wordline 108 of FIG. 7a) associated with a column of SRAM bits.

Circuit 740 receives a control signal 742 (RAM) that controls whether circuit 740 functions in a conventional mode or in a hardened mode. In the hardened mode, control signal 742 provides a logical low signal to address the SRAM bits coupled to the stage so that the SRAM bits can be forced to the desired data value, as discussed in reference to FIG. 7b.

For the conventional mode, control signal 742 provides a logical high signal and a control signal 744 (ENABLE) is controlled and data is shifted into corresponding shift registers of FIG. 7c to appropriately assert the desired address line, as would be understood by one skilled in the art. Alternatively, address decoding may be implemented rather than shift registers to control the address lines and thus, FIGS. 7b and 7c merely illustrate an exemplary implementation and are not limiting.

As used herein, hard coding refers generally to an SRAM-based FPGA (or a specific region of an SRAM-based FPGA) where the outputs of configuration bits are mask programmably wired to achieve a desired functionality (e.g., when the configuration bits are in the erased state). Also as used herein, hard encoding refers generally to an SRAM-based FPGA (or a specific region of an SRAM-based FPGA) where the outputs of configuration bits are mask programmably wired so as to randomize their function relative to the generic mask pattern.

With hard encoding, the SRAM-based FPGA is used in a conventional manner, with the desired functionality achieved when the SRAM bits are configured with the appropriate bit pattern. However, this bit pattern is scrambled relative to the bit pattern that would be used in an FPGA with the generic mask pattern. The scrambling can include both polarity and location transformations that would differ from region to region, with the result of making it difficult for a third party to decipher or make unauthorized use of the bit pattern. One purpose for hard encoding is for security.

In contrast, hard coding is when desired functionality is achieved when the SRAM bits are erased. This only requires that the mask programming select the polarity of the output of the SRAM bits to achieve the desired functionality. However, hard coding can be done in conjunction with location transformations also, but this may not be as necessary as in the encoding case, depending upon the desired application or requirements.

Figure 8:
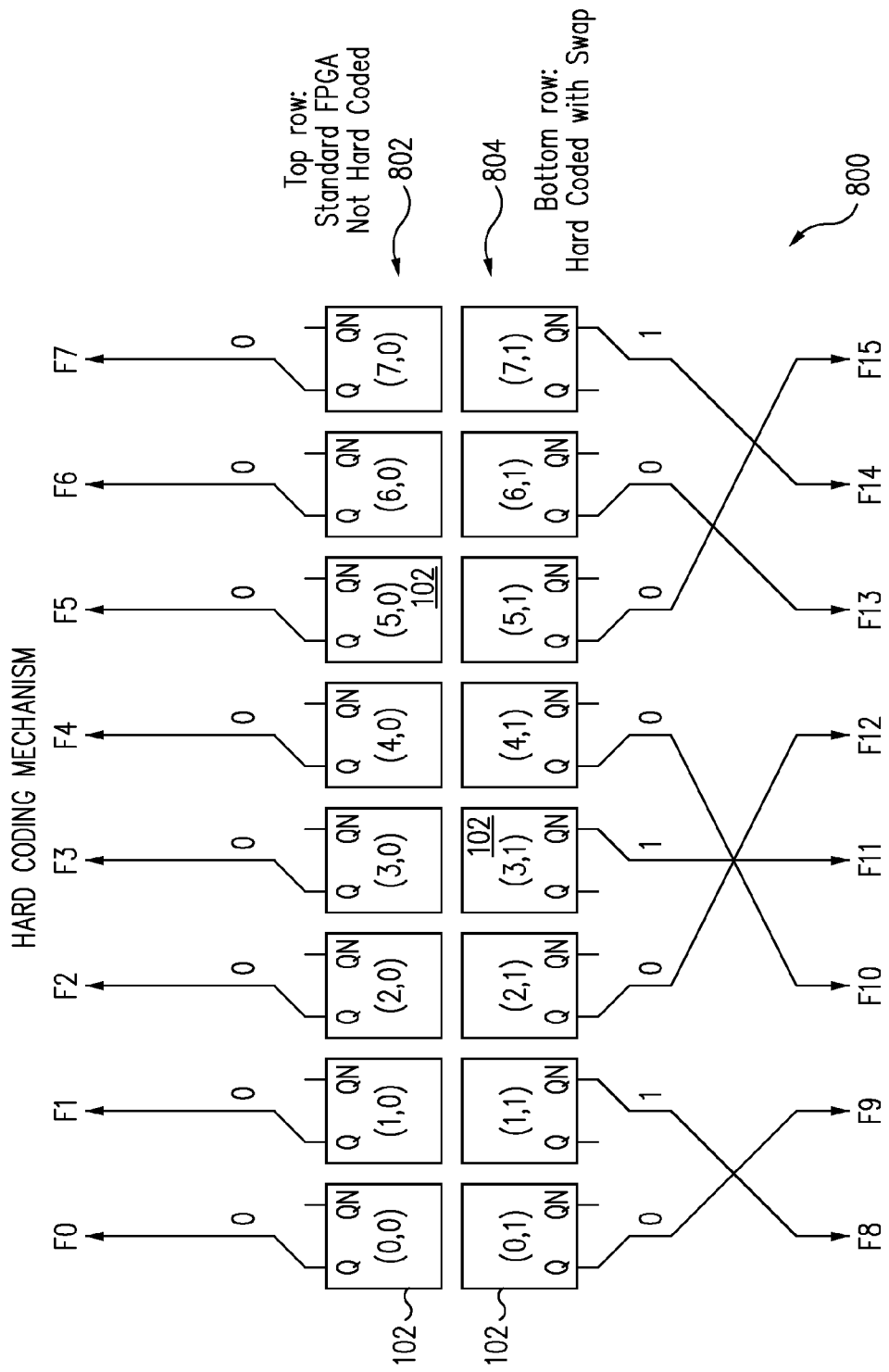
FIG. 8 shows a block diagram illustrating a hard coding with swap technique in accordance with an embodiment of the present invention.

FIG. 8 shows a block diagram of a portion of a PLD 800 that illustrates a hard coding technique in accordance with an embodiment of the present invention. The hard coding technique is similar to the hard coding technique discussed in reference to FIG. 7a, but further provides a location transformation (or swap) of the Q and QN output signal paths from configuration cells 102 (e.g., neighboring configuration cells 102). As discussed further herein, the hard coding with swap technique (coding with swap) may provide a higher degree of randomization and security and prevent downloaded patterns from being decipherable.

Specifically, configuration cells 102 in rows 802 and 804 illustrate a conventional row and a hard coded (with swap) row of configuration cells 102, respectively. As an example and assuming configuration cells 102 store logical zero values, configuration cells 102 in row 802 provide the logical zero value as their Q output signal in a conventional PLD fashion. However, for the mask customized output paths for row 804, the Q or QN output signal is hard coded (as described for PLD 700) and the output path rerouted, as illustrated in an exemplary fashion in FIG. 8. Consequently, the hard coding with swap technique may provide additional randomization and security benefits which would be particularly useful for hard encoding.

In general, in reference to FIGS. 7a and 8, a user can develop and finalize his/her design using a conventional SRAM based PLD. Once the design is ready for production and field deployment, the user would order a mask customized PLD from the manufacturer with certain features. For example, the user defined pattern (UDP) is hardwired as part of the SRAM configuration cells (e.g., similar to a ROM and referred to as ROM mode). When the PLD is in ROM mode, the ROM pattern is being continuously forced, with the PLD providing ASIC-equivalent SEU protection. Furthermore, as a significant feature, the SRAM configuration cells are still fully programmable. Thus, the PLD can be fully tested by the manufacturer using conventional methods and the user still has the option of programming a different function or design into the PLD in the future, such as for field upgrades. However, in this mode (referred to as SRAM mode), the PLD is SRAM based and SEU protection is equivalent to that of a conventional PLD.

Security for the hard coded pattern and for field upgrades is provided due to the way the ROM mode is hard coded into the SRAM configuration cells, as explained further herein. Briefly, the mask customization (e.g., metal mask customization) hard codes the UDP into the configuration cells (e.g., the ROM-like portion or ROM mode). Consequently, if another tries to read back the ROM pattern stored in the configuration cells, every configuration cell for example appears to have been programmed with a default logical zero value (all-clear value of "0").

It should be understood that any new programmable pattern (UDP) for this mask-customized PLD must first be transformed to provide a bit stream that will work properly with the pattern that is hard coded into the PLD. Once the bit stream for the new pattern is generated, it can only be decoded (properly implemented) by a PLD that has the original user pattern hard coded into the configuration cells. Thus, an intercepted pattern would be useless if loaded into a PLD that does not have the same hard coding. Furthermore, because the hard coded pattern is only known by the user, a third party could not load another pattern into the secured PLD as the third party would not know how to transform and generate the appropriate bit stream.

As another advantage, depending upon which technique or combination of techniques disclosed herein are implemented, there may also be little or no additional hardware or die area penalty. Furthermore, in accordance with one or more embodiments of the present invention, SEU hardening and/or hard coding and/or hard encoding may be limited to certain regions of the PLD, allowing proprietary hard coded and/or proprietary encoded soft cores to be mixed with logic which is not encoded. Additionally, the encoding can vary from region to region, which allows independent proprietary cores (encoded differently) to be provided on the same PLD with independent security for each core. Consequently, a hierarchy of customers (customers who are vendors to other customers) can maintain security for their corresponding IP (e.g., intellectual property (IP) developers for the first time can maintain security for their IP or proprietary cores).

Figure 9A:
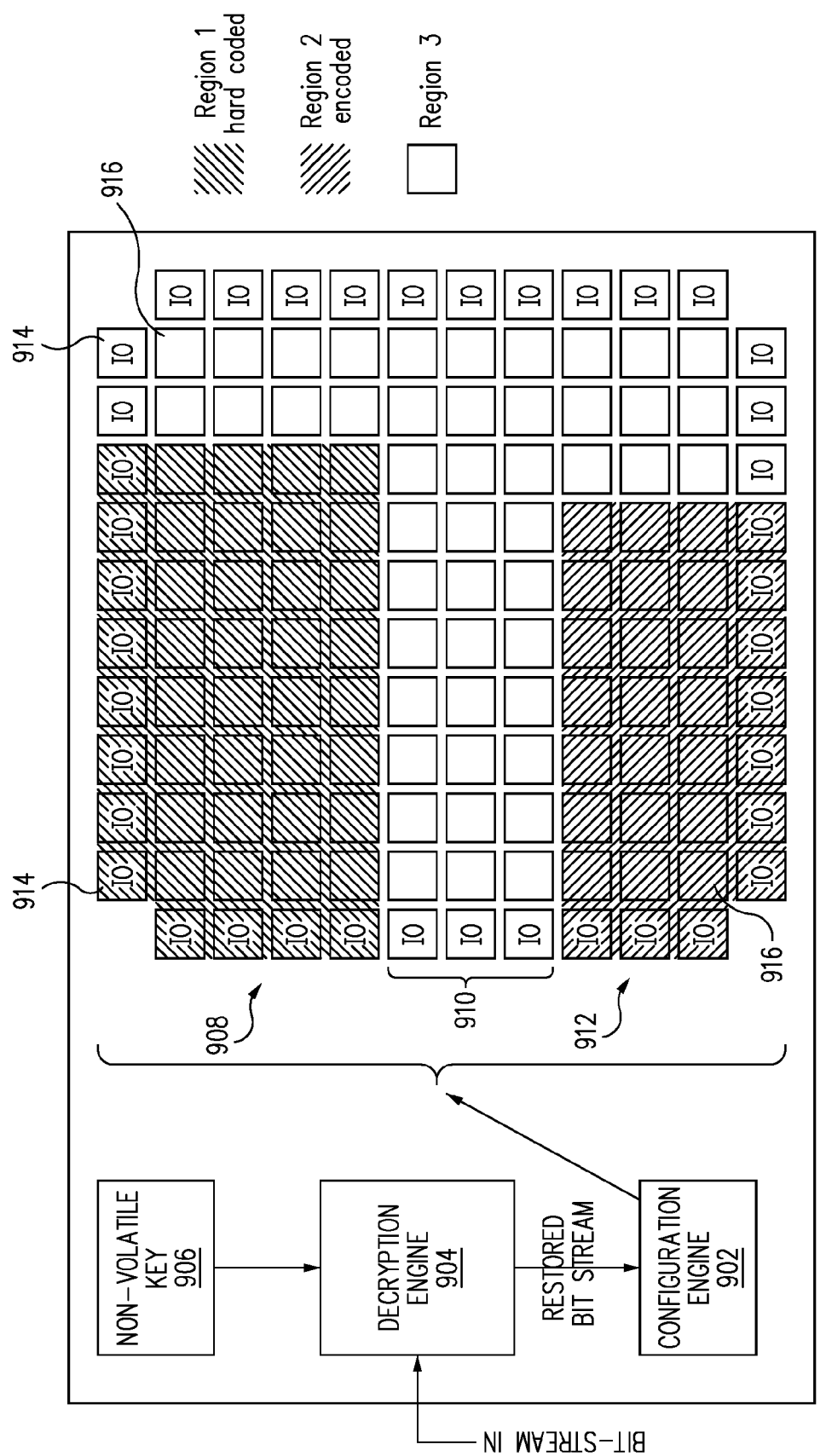
FIG. 9a shows a block diagram of a programmable logic device illustrating different regions for hard coding and/or hard encoding techniques in accordance with embodiments of the present invention.

For example, FIG. 9a shows a block diagram of a PLD 900 illustrating different regions, which may provide various SEU hardening techniques, hard coding, and/or hard encoding techniques in accordance with one or more embodiments of the present invention. PLD 900 includes input/output (I/O) blocks 914 (labeled 10) and logic blocks 916 and would generally also include an interconnect structure and optionally embedded memory blocks (neither of which are shown for clarity).

PLD 900 is shown in an exemplary fashion as divided into a hard coded region 908 (region 1) and a hard encoded region 912 (region 2), with the remaining region 910 (region 3) not hard coded or hard encoded (e.g., implemented in a conventional fashion). Hard coded region 908 is implemented to provide hard coding (e.g., as described in reference to FIG. 7a, 8 for hard-wired Q or QN output). Hard coded region 908 may be further implemented to provide SEU hardening, as described in reference to FIGS. 3-7a. Hard encoded region 912 is implemented to provide hard encoding which would be typically hard coded with swap (e.g. as in FIG. 8) and would not be SEU hardened. Thus, PLD 900 provides an implementation example for providing hard coded (with or without SEU hardening) and/or hard encoded regions within a PLD (e.g., to support a hierarchy of customers and/or security levels for various logic cores), which may include the entire PLD or with some portion left implemented in a conventional fashion (e.g., region 910).

The configuration bit stream to PLD 900 may be further secured in a conventional fashion to add additional security protection or to provide protection for the bit stream for region 910. For example, PLD 900 may further include a non-volatile decryption key circuit 906 for storing a non-volatile decryption key, a decryption engine circuit 904, and a configuration engine circuit 902. Configuration engine circuit 902 functions to download the bit stream to the configuration cells within PLD 900 (e.g., by controlling address and bit lines in a conventional fashion as discussed herein). Furthermore, configuration engine circuit 902, in accordance with one or more embodiments, can also provide the proper signals (e.g., control signals and/or address and bit line values) to force PLD 900 (or some portion of PLD 900) into ROM-mode (e.g., for hard coded configuration cells).

The bit stream provided to PLD 900 may be in the form of an encrypted bit stream. Decryption engine circuit 904 and non-volatile decryption key circuit 906 are implemented in a conventional fashion to decode (decrypt) the encrypted bit stream and provide the restored (unencrypted) bit stream to configuration engine circuit 902. In general for security purposes, a user of PLD 900 would not have access to copy or examine the restored bit stream within PLD 900.

In general, PLDs (e.g., an FPGA) produced using advanced processes (e.g., low voltage) can make use of the techniques disclosed herein, such as for example as discussed in reference to FIGS. 3, 6, 7, and 8. As an example, the techniques disclosed in reference to FIG. 3 may have some area penalty due to the additional transistors and control signals and may not provide the desired level of security. However, this technique does offer the advantage of regional freedom, where any group of bits can be hardened with SEU protection while the remainder may be implemented with conventional SRAM techniques (e.g., not hard coded/encoded or SEU protected).

In contrast, the techniques disclosed in reference to FIGS. 6 and 7 may provide the desired level of security, hardening (e.g., hard coded/encoded), and SEU protection with little or no area impact. However, there may be regional limitations with respect to providing SEU protection. Specifically, to provide SEU protection for a group of bits, the address lines for these SRAM bits must be held high while the PLD is in normal operation and thus, all SRAM bits which share the address line may be affected (e.g., would also have to be hard coded).

Figure 9B:
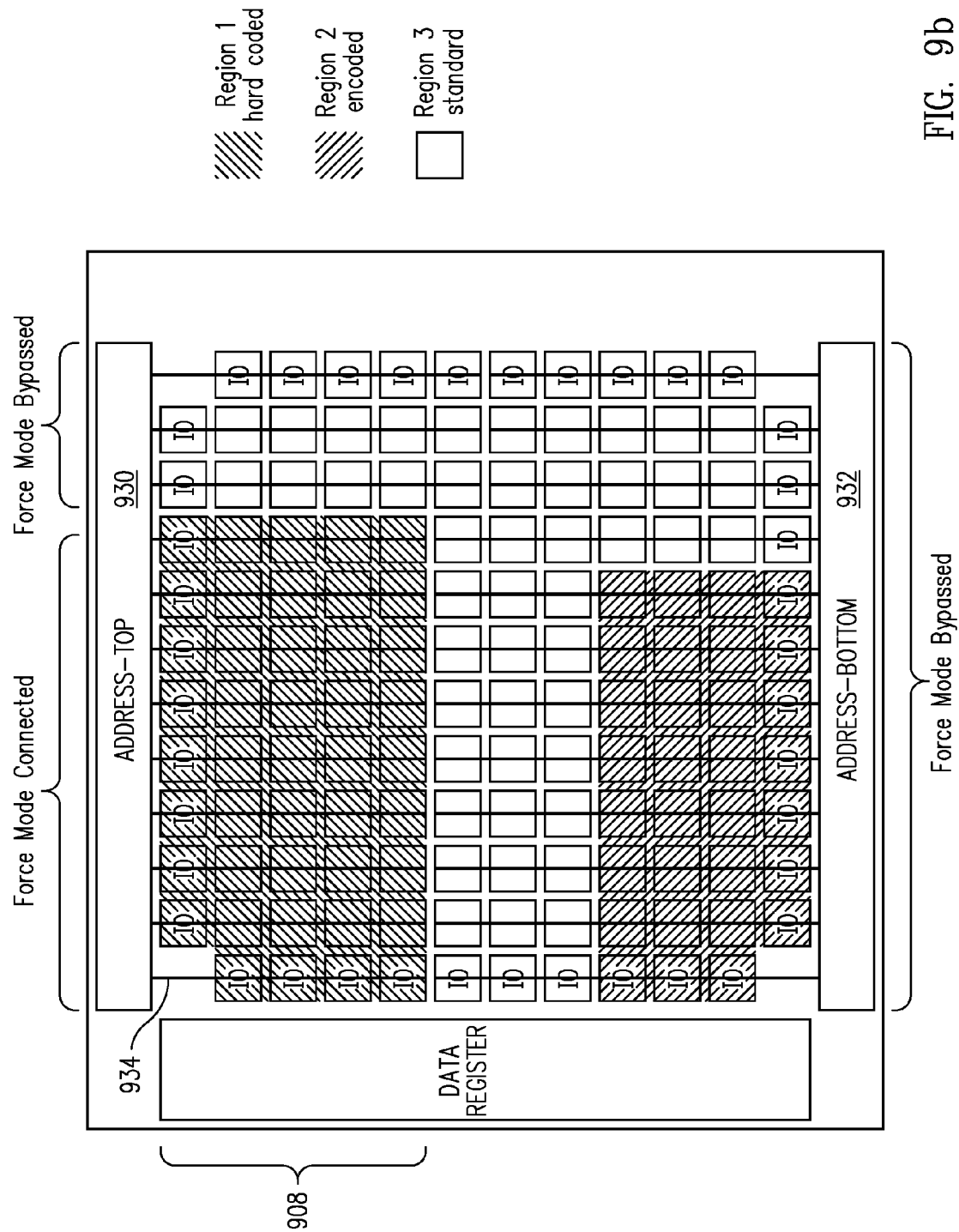
FIGS. 9b-9e show block diagrams of a programmable logic device and exemplary circuit implementations for portions of FIG. 9a in accordance with an embodiment of the present invention.
Figure 9C:
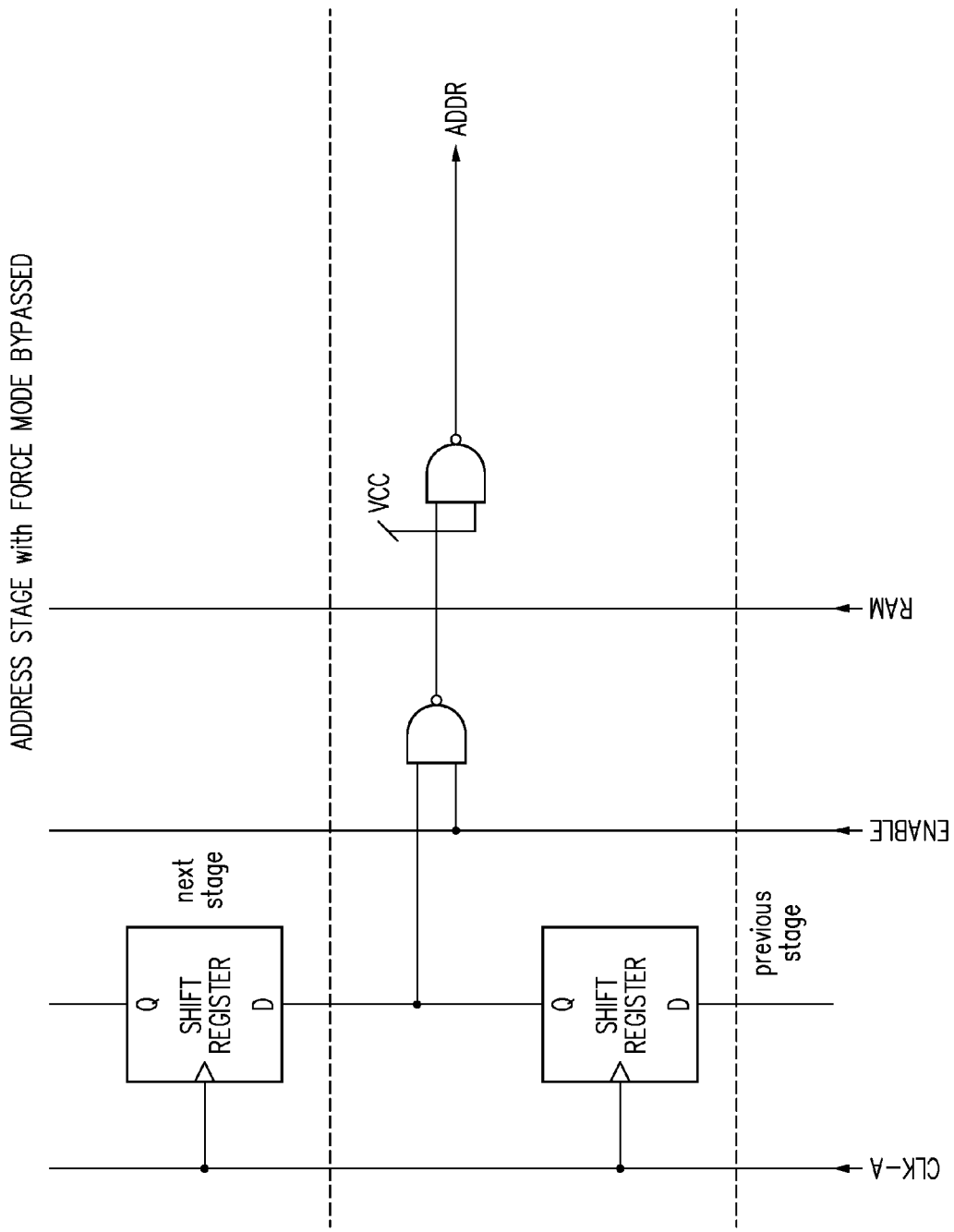

For example, hard coded region 908 may be implemented as shown in FIG. 9a with SEU protection if there are two or more sets of address shift registers (e.g., one address shift register 930 along the top (labeled ADDRESS-TOP) and one address shift register 932 along the bottom (labeled ADDRESS-BOTTOM)) as illustrated in FIG. 9b in accordance with an embodiment of the present invention. The RAM signal for address shift register 930 (for the SEU hardened columns) would be as discussed in reference to FIG. 7c (i.e., control signal 742 (RAM)). In non-SEU protected columns and for address shift register 932 in accordance with an embodiment of the present invention, the RAM signal would bypass the NAND gate as shown in FIG. 9c (e.g., where the NAND gate input is mask programmably tied to a supply voltage (labeled VCC)). Address lines (e.g., bold lines 934 as shown in FIG. 9b) from address shift register 930 would be mask programmable to only extend over hard coded region 908 (as illustrated in FIG. 9b). As an example, each bold vertical line (each bold line 934) may represent a bus of 50 or more address lines spread out across the PLD (e.g., logic block section or configuration memory section of the PLD).

Thus, SEU protection for hard coded region 908 (shaded as indicated in FIG. 9b) may be forced to provide SEU protection, which may be referred to as force mode. The force mode provides certain address wires only for hard coded region 908, in this example, which allows for SEU protection for hard coded region 908 and no SEU forced protection (force mode bypassed) for other regions of the PLD (e.g., hard encoded region 912 and conventional region 910).

Figure 9D:
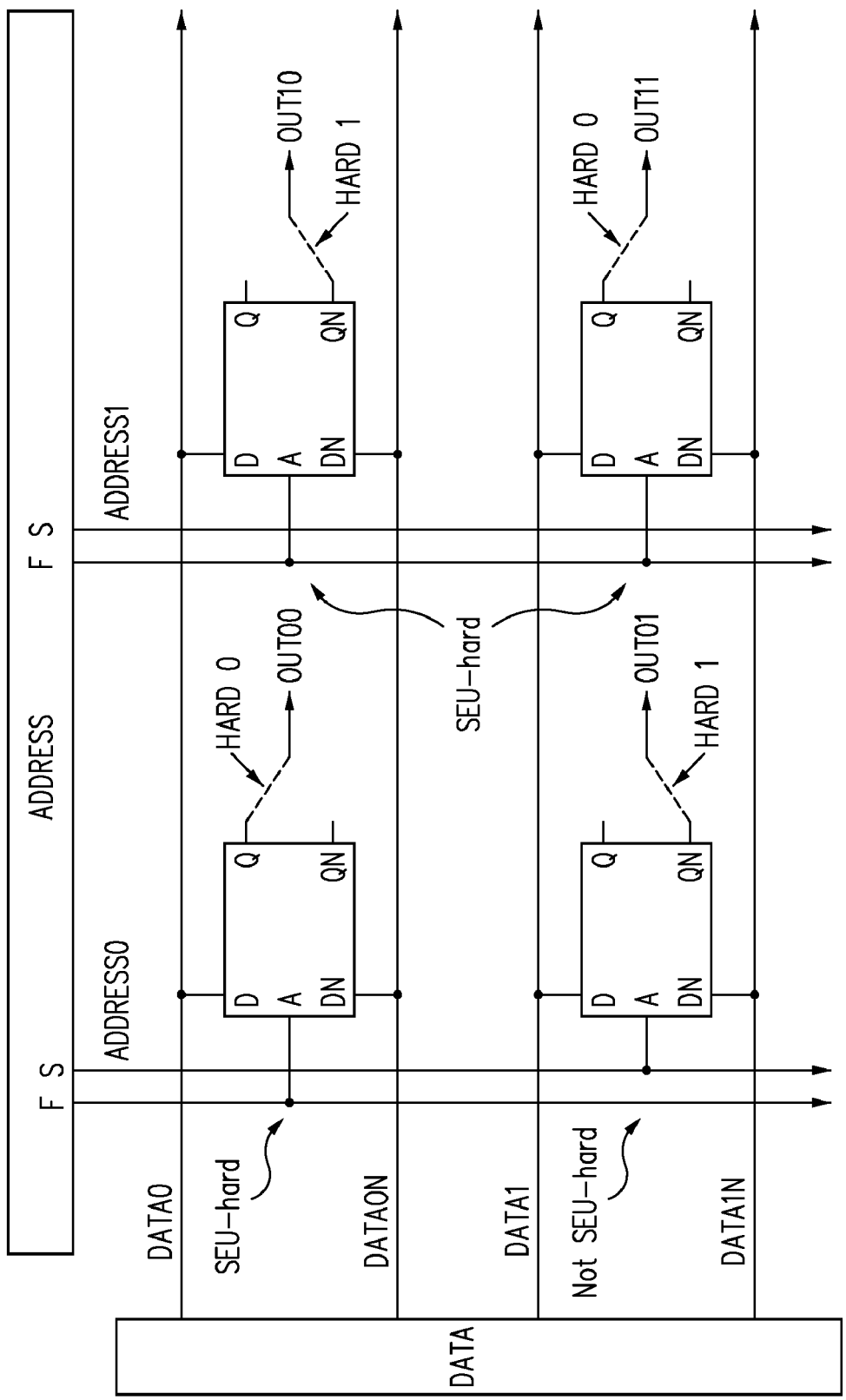
Figure 9E:
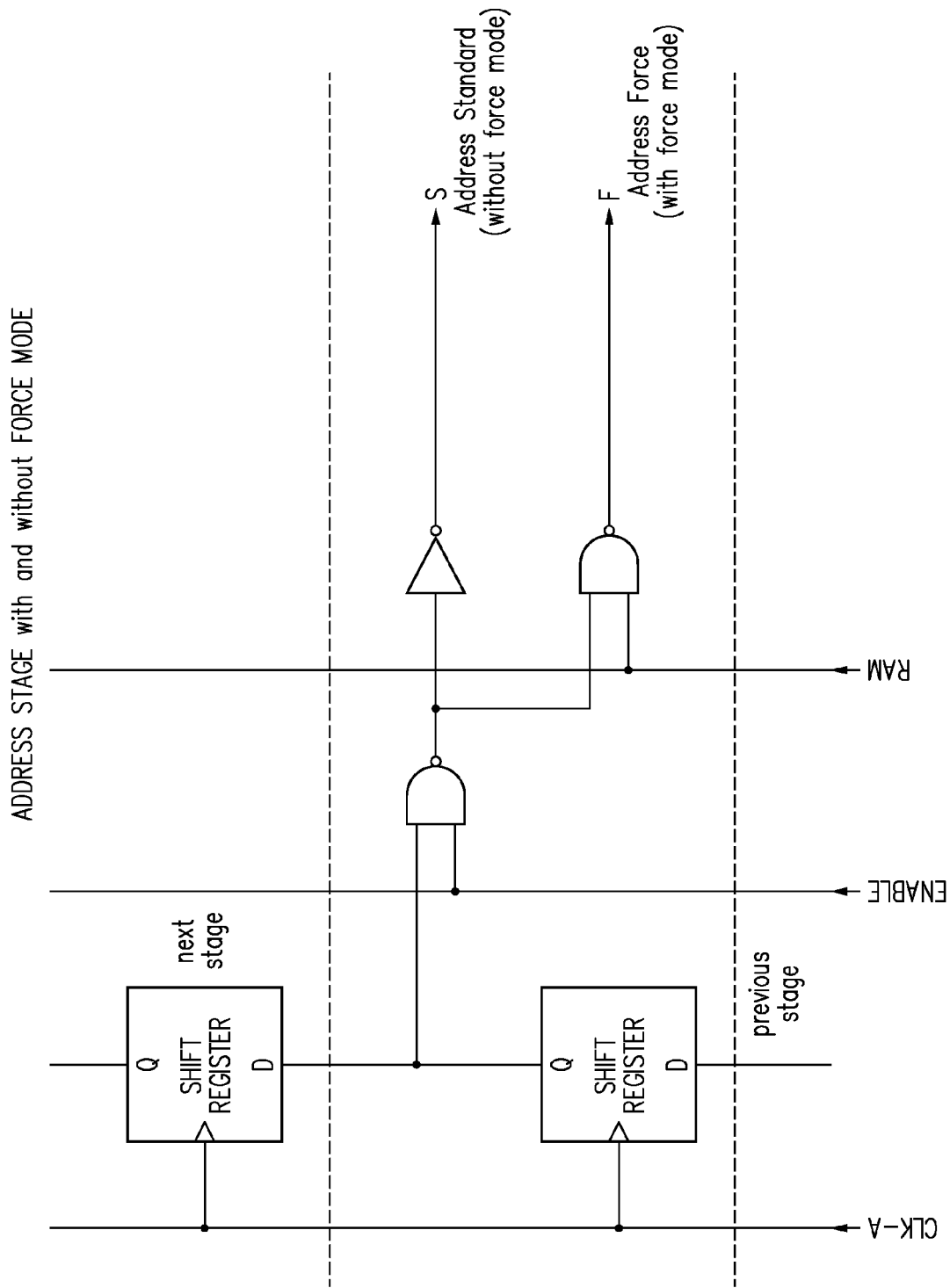

Alternatively in accordance with one or more embodiments of the present invention, FIGS. 9d and 9e illustrate techniques for implementing, for example, hard coding (e.g., with and without SEU hardening), hard encoding, and conventional SRAM with complete flexibility in placement. As shown, this is accomplished with two sets of address lines (labeled F and S) that can be mask programmably selected (e.g., on a configuration memory cell by configuration memory cell basis) where one address line (F) supports SEU hardening and the other address line (S) does not support SEU hardening. Thus, the F address line enables SEU hardening, while the S address line is for SRAM mode configuration without SEU hardening. It should be understood that although no additional transistors may be required, there may be some area impact due to the additional address wires, with the added circuitry in the address stage generally having no significant area impact.

The bit stream provided to a PLD implemented in accordance with one or more embodiments of the present invention as discussed herein (e.g., in reference to FIGS. 3-9a) may have to be converted in an appropriate fashion based upon the hard coding, hard encoding, or other techniques implemented as disclosed herein. For example, FIGS. 10-13 show exemplary bit stream techniques for exemplary frames (or sections of a frame) of a bit stream (or configuration data) for a PLD providing SEU hardening, hard coding, and/or hard encoding in accordance with one or more embodiments of the present invention.

Figure 10:
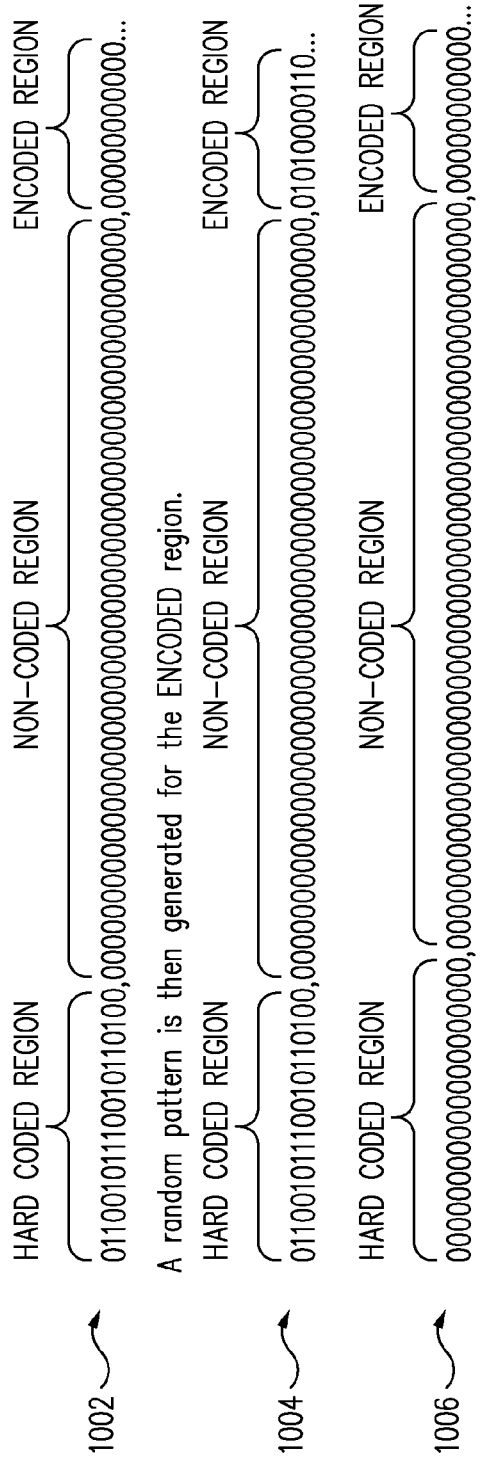

Specifically, FIG. 10 illustrates a process for hard coding the bit stream to convert the bit stream into a hard pattern for implementation within a PLD. The bit stream, for example, can be divided into a sequence of frames. Each frame corresponds to a particular address line and each bit in the frame corresponds to a stage in the data shift register (e.g., DSR 106), where each stage can drive a particular data line. A single frame may overlap a combination of hard coded regions, encoded regions, and non-coded regions. Thus, for example, using a floor-planner, the IP vendor locates the IP intended for hard coding in some region of the PLD and also defines the region intended for encoding.

As an example, a frame 1002 (or a section of a frame) is shown as an exemplary bit stream frame in FIG. 10. A random pattern may then be generated for the encoded region as illustrated in an exemplary fashion as a frame 1004 for frame 1002. The PLD manufacturer may then convert the resultant bit stream into a hard pattern, as exemplified by a frame 1006) with one (or more) masks. Although the hard coded region and the encoded region are now physically different, the PLD bit stream verifies as erased. The PLD manufacturer, for example, may also provide their customer, the IP vendor, with a CODE file that is used to convert generic bit streams to transformed bit streams that are compatible with the hard pattern of the PLD.

Figure 11:
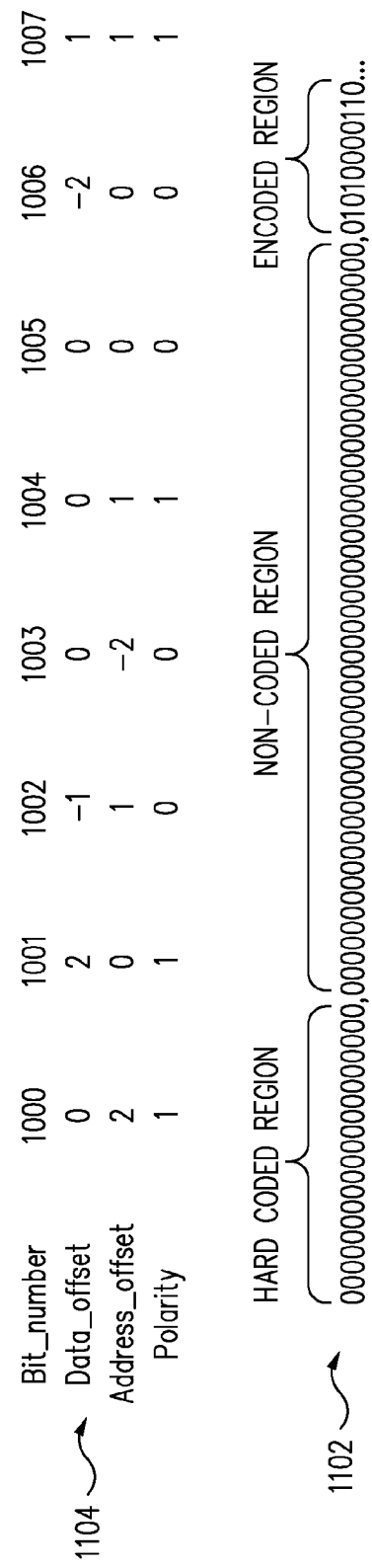

FIG. 11 illustrates a process for transforming an encoded bit stream. For example, the IP vendor's pattern that is to reside in the encoded region needs to be transformed for the encoded region of the PLD. An exemplary frame 1102 (e.g., a generic bit stream) is shown for the generated IP. This bit stream frame is then transformed using a CODE file that corresponds to the hard mask(s).

An exemplary code file 1104 is shown that consists of an array, where each element corresponds to a bit (with a corresponding Bit number) in the bit stream. For example, each element consists of a Data offset, an Address offset, and a Polarity bit for the Bit number. It should be understood that code file 1104 would generally actually start at 1 for the Bit number, but code file 1104 is shown starting at Bit number 1000 to show that there can be both positive and negative Address offsets (i.e., a negative Address offset in the first frame would not make sense). In non-coded regions, the Data offset, Address offset, and Polarity would all equal 0. In hard coded regions without swap, the Data offset and Address offset may all equal 0 (thus hard coding without swap offers the advantage of a smaller CODE file relative to hard coding with swap).

As an example, the general procedure would be to first create a new blank bit stream (NBS) file. As a generic bit stream is read, the NBS file is altered using the CODE file according to the following encoding rule or operation. As each bit is read from the generic bit stream, a location (Loc_new) in the NBS file is calculated as shown in equation (1), $$\text{Loc\_new} = \text{Bit\_number} + \text{Data\_offset} + \text{Address\_offset} * \text{Frame\_size} \qquad (1)$$

where Frame_size equals the number of bits in each frame and "*" indicates a multiplication. The bit in the NBS file at location Loc_new is assigned the value of the bit (from the generic bit stream) logically combined (e.g., by an exclusive or (XOR) function) with the polarity bit in the CODE file. This process is repeated for each bit in the generic bit stream.

The resultant NBS file in this way is transformed into an encoded bit stream, as shown by an exemplary frame 1202 of FIG. 12, which is compatible with the hard mask of the PLD. The IP vendor may then send this encoded bit stream to their customer. Meanwhile as an example, the customer developed their own pattern, which resides in a user's pattern region (non-coded region) as illustrated by an exemplary frame 1204 of FIG. 12. Upon receipt of the IP vendors bit stream, the customer can merge the IP vendors bit stream (e.g., bit-wise OR operation) with their own bit stream pattern to generate a new bit stream (i.e., a combined bit stream) as illustrated by an exemplary frame 1206 of FIG. 12. The customer may then also optionally choose to protect their own pattern by conventional key-encryption (as noted earlier). This would encrypt the entire bit stream and so would also encrypt the IP vendor's part of the bit stream and provide further security.

FIG. 13 illustrates an example of updating a hard coded region of an exemplary frame of a bit stream. In this example, the IP vendor's pattern is in the hard coded region and needs to be altered (i.e., where the hard coding is accomplished with polarity inversions only). A new exemplary frame 1302 shows the IP vendor's pattern, where the first 4 bits are now 1011, that provides an upgrade to the hard coded region having the previous hard coded pattern values as shown by exemplary frame 1304. A new bit stream is generated (e.g., as shown by exemplary frame 1306) by logically combining (e.g., by bit-wise exclusive OR (XOR) operation) frame 1302 with frame 1304, which may then be sent to the IP vendor's customer. Thus, it should be noted that only the bits that change state from the original pattern show up in the resultant bit stream. Consequently, minor alterations to the vendors IP reveal little about the IP's content.

As discussed herein in accordance with one or more embodiments of the present invention, the hard coding may be compartmentalized (e.g., as discussed in reference to FIG. 9a) to provide security for multiple third party IP, which can coexist independently in the same PLD. This may create the opportunity for a more viable IP market, because for example it allows one IP developer (e.g., party D0) to provide a pattern in one region of the PLD, another IP developer (e.g., party D1) to provide a pattern in another region, while leaving the rest of the PLD for the customer (e.g., party C, who may choose whether to encode their pattern).

As an example, party D0 and party D1 could send out encoded field upgrades (e.g., as disclosed in reference to FIG. 13) to party C, who could combine them with their own pattern (e.g., as disclosed in reference to FIG. 12) and/or send them out to the end customers or users, yet none of the parties could decode the others IP (including party C). As another example, an IP developer (party D) could enter the hardware business by buying and selling PLDs from a manufacturer along with proprietary IP from party D. Thus, the PLD manufacturer's customer would be the independent IP developer (party D) who could re-sell the PLD containing the IP developer's hard coded IP, while party D's customer (party C) would be free to develop their own pattern in the non-encoded region. Consequently, the IP developer (party D) can keep their IP secure while providing their customers with a hardware solution analogous to an ASIC (e.g., in terms of SEU hardened) that contains a block of user configurable SRAM based PLD.

Additionally, party D's customer (party C) may have proprietary IP of their own (e.g., located in the non-coded region), which could be protected using conventional methods (e.g., on chip flash memory with security bits to prevent the pattern from being read, or key-encoding or encryption of the configuration bit stream provided to the PLD) and which would add a layer of encryption on party D's IP. Alternatively, party C could decide to hard code their IP as well, with the PLD manufacturer being the middle-man and brokering an agreement between party C and party D and combine party C's code with party D's code to make a single ROM-mode pattern (UDP). Party C would be the PLD manufacturer's customer, yet party D would be informed of every part shipped to party C with the combined UDP.

As a further example, party D may choose to hard code/ encode a unique but arbitrary pattern in a particular region of the PLD (e.g., as disclosed in reference to FIG. 9a). Party D would own that region, secure in the knowledge that any pattern that is loaded into the encoded region is undecipherable (e.g., if the configuration memory cells for that region all store "0" or "1"). Party D could then exploit that region for various IP, while leaving the remainder (non-encoded) part of the PLD available to their customers (party C) who would use standard PLD manufacturer software without any encoding. Party C may only need to be provided with a description of where (physically) the IP (located in the hard encoded region) exists in the PLD (and where its ports are) along with the IP which would consist of an encoded bit stream (e.g., as discussed in reference to FIGS. 10-13). Party C would develop their pattern in exactly the same way as the hard-coded case (excluding the region where party D's IP is located), but when they generate the bit stream, party D's encoded bit stream is logically combined (e.g., logical OR) with it, thus creating a combined bit stream. In this fashion, party D would only have the capital cost of one hard encoding (tooling consisting of one or more masks) to provide security for all of its developed IP. Party D's customer (party C) may have proprietary IP of their own (located in the non-encoded region) which could be protected using conventional methods noted herein (e.g., flash memory or bit stream key-encoding), which would also add a layer of encryption on party D's encoded IP.

Alternatively as a further example, party C could decide to encode their IP as well, where the PLD manufacturer would be the middle-man and broker an agreement between party C and party D and combine party C's encoding with party D's encoding, to make a single ROM-mode encoding pattern. Party C would be the PLD manufacturer's customer, but party D would be informed of every part shipped to party C with the combined pattern (UDP).

Alternatively, party D could decide to hard encode the entire PLD. Party D would then not have to anticipate what part of the PLD would be used for future IP. Party D could then develop IP in a particular region and provide their customer (party C) with a description of where the IP is located and the encoding pattern of the remaining region. Party D, for security, could further arrange placement of various IP to overlap so as to maximize the kernel of the protected IP region. Note that this also offers some protection for party C's IP because only customers of party D would have access to the encoding of the remaining region. Party C may also choose to exploit further protection by using conventional methods as noted herein (e.g., flash memory with security bits or key-encoding), which would also add a layer of encryption on party D's encoded IP.

In general, systems and methods are disclosed herein in accordance with one or more embodiments of the present invention to provide, for example, hardened programmable memory. For example, in accordance with an embodiment of the present invention, SEU hardening techniques and SEU hardened SRAM cells are disclosed (e.g., to provide PLDs hardened against SEU).

For example in accordance with one or more embodiments of the present invention, the PLD may provide configuration cells (e.g., SRAM cells) that are hardened against SEUs, but that still retain their programmability or configurability (e.g., useful for system developers for system production applications). The SEU hardening techniques disclosed herein may add little (if any) to the cost of manufacturing the PLD, but still allow programming of the configuration cells, such as for testing or other desired utilizations.

The various techniques disclosed herein, such as hard coding or hard encoding as examples, may also help prevent unauthorized use of the bit stream or IP core. Consequently, an unauthorized user or thief who copies the configuration data can not simply download the proprietary configuration data into a conventional PLD and avoid the development expenses, as the configuration data is matched to the hard coding/encoding of the PLD. Thus, techniques disclosed herein may allow ultra-secure field upgrades.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device (PLD) comprising:
   a plurality of configuration memory cells adapted to store configuration data bits of a user design, each cell having at least one input node to receive a configuration bit and at least one output node to provide the configuration bit;
   a plurality of address lines coupled to the configuration memory cells;
   a plurality of bitlines coupled to the input nodes of the configuration memory cells;
   logic circuitry adapted to force the address lines and bitlines to predetermined logical values in an SEU-hardened mode, wherein the address lines and bitlines force the at least one output node of each memory cell to a predetermined logical value; and
   a mask programmable connection associated with each memory cell for connecting the at least one output node of the memory cell to configurable resources of the PLD, wherein in the SEU-hardened mode and with the mask programmable connections programmed, the memory cells provide configuration data bits having the predetermined logical values of the output nodes of the memory cells to the configurable resources.

2. The programmable logic device of claim 1, wherein the at least one output node of a configuration memory cell is one of a Q output node and QN output node.

3. The programmable logic device of claim 1, wherein the plurality of memory cells comprises a row of memory cells.

4. The programmable logic device of claim 1, wherein the memory cells are six-transistor SRAM cells.

5. The programmable logic device of claim 1, wherein the logic circuitry is adapted to force the address lines to a same logical value in the SEU-hardened mode.

6. The programmable logic device of claim 1, wherein the logic circuitry is adapted to force the bitlines to a same logical value in the SEU-hardened mode.

7. The programmable logic device of claim 1, wherein the logic circuitry is adapted to allow each memory cell to be programmed in a conventional manner in a programming mode.

8. The programmable logic device of claim 1, wherein the mask programmable connections comprise metal layers within the PLD.

9. The programmable logic device of claim 1 including:
   an address shift register coupled to the address lines;
   a data shift register coupled to the bitlines; and
   the logic circuitry includes a first logic gate associated with each address line and a second logic gate associated with each bitline,
   wherein the logic gates are responsive to a control signal such that in the SEU-hardened mode the logic gates force the address lines and bitlines to predetermined logical values and in a programming mode the logic gates allow each memory cell to be programmed in a conventional manner through the address shift register and data shift register.

10. A method of hardening configuration memory cells of a programmable logic device (PLD) against soft error upsets (SEUs), the method comprising:
   providing an array of configuration memory cells adapted to store configuration data bits, each cell having at least one input node to receive a configuration bit and at least one output node to provide the configuration data bit;
   obtaining a user design for the PLD; and
   mask programming connections between the at least one output node of each memory cell and configurable resources of the PLD such that the memory cells provide the configuration data bits of the user design to the configurable resources when the output nodes of the memory cells are forced to predetermined logical values.

11. The method of claim 10, wherein the at least one output node of a configuration memory cell is one of a Q output node and QN output node.

12. A programmable logic device (PLD) comprising:
   a plurality of configuration memory cells adapted to store configuration data bits, each cell having at least one input node to receive a configuration data bit and at least one output node to provide the configuration data bit;
   a plurality of address lines coupled to the configuration memory cells;
   a plurality of bitlines coupled to the input nodes of the configuration memory cells;
   logic circuitry adapted to force the address lines and bitlines to predetermined logical values, wherein the address lines and bitlines force the at least one output node of each memory cell to a predetermined logical value; and
   a mask programmable connection between each memory cell and configurable resources of the PLD for connecting the at least one output node of the memory cell to the configurable resources.

13. The programmable logic device of claim 12, wherein the at least one output node of a configuration memory cell is one of a Q output node and QN output node.

14. The programmable logic device of claim 12, wherein the logic circuitry is adapted to force the address lines to a same logical value.

15. The programmable logic device of claim 12, wherein the logic circuitry is adapted to force the bitlines to a same logical value.

16. The programmable logic device of claim 12, wherein the logic circuitry, through the address lines and bitlines, is adapted to force the at least one output node of each memory cell to a same logical value.

17. The programmable logic device of claim 12, wherein the logic circuitry includes logic gates coupled between the address lines and the configuration memory cells and the bitlines and the configuration memory cells, the logic gates adapted to force the address lines and bitlines to the predetermined logical values.

18. The programmable logic device of claim 12, wherein the logic circuitry is further adapted to allow each memory cell to be programmed in a conventional manner.

19. The programmable logic device of claim 12, wherein the mask programmable connections comprise metal layers within the PLD.

20. The programmable logic device of claim 12, wherein the memory cells are six-transistor SRAM cells.

\* \* \* \* \*